(12) United States Patent
Mizutani et al.

(10) Patent No.: US 10,840,258 B2
(45) Date of Patent: Nov. 17, 2020

(54) SEMICONDUCTOR DEVICE

(71) Applicant: TOSHIBA MEMORY CORPORATION, Tokyo (JP)

(72) Inventors: Masaharu Mizutani, Yokkaichi Mie (JP); Yoichi Minemura, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/109,381

(22) Filed: Aug. 22, 2018

(65) Prior Publication Data

US 2019/0287989 A1 Sep. 19, 2019

(30) Foreign Application Priority Data

Mar. 13, 2018 (JP) .................... 2018-045682

(51) Int. Cl.
*H01L 27/11582* (2017.01)
*H01L 29/78* (2006.01)
*H01L 27/11568* (2017.01)

(52) U.S. Cl.
CPC .. *H01L 27/11582* (2013.01); *H01L 27/11568* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,946,665 | B2 | 2/2015 | Shim et al. |
| 9,530,697 | B1 | 12/2016 | Nakaki |
| 9,741,736 | B2 | 8/2017 | Akutsu |
| 9,780,105 | B2 | 10/2017 | Yamada |
| 9,786,679 | B2 * | 10/2017 | Fukuzumi ......... H01L 27/11565 |
| 9,793,283 | B1 | 10/2017 | Pang et al. |
| 9,991,276 | B2 | 6/2018 | Sonehara et al. |
| 2014/0035024 | A1 | 2/2014 | Noh |
| 2017/0077108 | A1 * | 3/2017 | Kawaguchi ....... H01L 27/11565 |

FOREIGN PATENT DOCUMENTS

| | | |
|---|---|---|
| TW | 201711139 A | 3/2017 |
| TW | 201721827 A | 6/2017 |
| TW | 201735327 A | 10/2017 |

* cited by examiner

*Primary Examiner* — Thien F Tran
(74) *Attorney, Agent, or Firm* — Kim & Stewart LLP

(57) ABSTRACT

A semiconductor device includes a base, a stacked body, a plate-shaped portion, and first to third columnar portions. The stacked body is provided over the base. The plate-shaped portion is inside the stacked body from an upper end of the stacked body to the base. The first to third columnar portions are inside the stacked body from the upper end of the stacked body to the base. The second columnar portion is located away from the first columnar portion in a first direction. The third columnar portion is aligned with the first columnar portion and the second columnar portion in the first direction. A pitch between the third columnar portion and the first columnar portion is a first pitch. A pitch between the third columnar portion and the second columnar portion is a second pitch larger than the first pitch.

11 Claims, 15 Drawing Sheets

SEMICONDUCTOR DEVICE

CROSS-REFERENCE TO RELATED APPLICATIONS

This application is based upon and claims the benefit of priority from Japanese Patent Application No. 2018-045682, filed Mar. 13, 2018, the entire contents of which are incorporated herein by reference.

FIELD

Embodiments described herein relate generally to a semiconductor device.

BACKGROUND

Nonvolatile memories that include stacked bodies in which insulating layers and conductive layers are alternately stacked one over the other and which include a plurality of memory cells with a three-dimensional structure stacked in the height direction of the stacked body are known. The memory cells are provided between the stacked body and columnar portions and include semiconductor layers along the height direction of the stacked body. The memory cells are electrically connected in series between, for example, drain-side select transistors provided in upper regions of the stacked body and, for example, source-side select transistors provided in lower regions of the stacked body. This is called a NAND string (or a memory string). The conductive layers stacked in the height direction of the stacked body serve as a gate of the drain-side select transistor (a drain-side selection gate), a control gate (word line) of the memory cell, and a gate of the source-side select transistor (a source-side selection gate). It is desirable to achieve low resistance of the conductive layers in the stacked body.

DETAILED DESCRIPTION

Figure 1A:
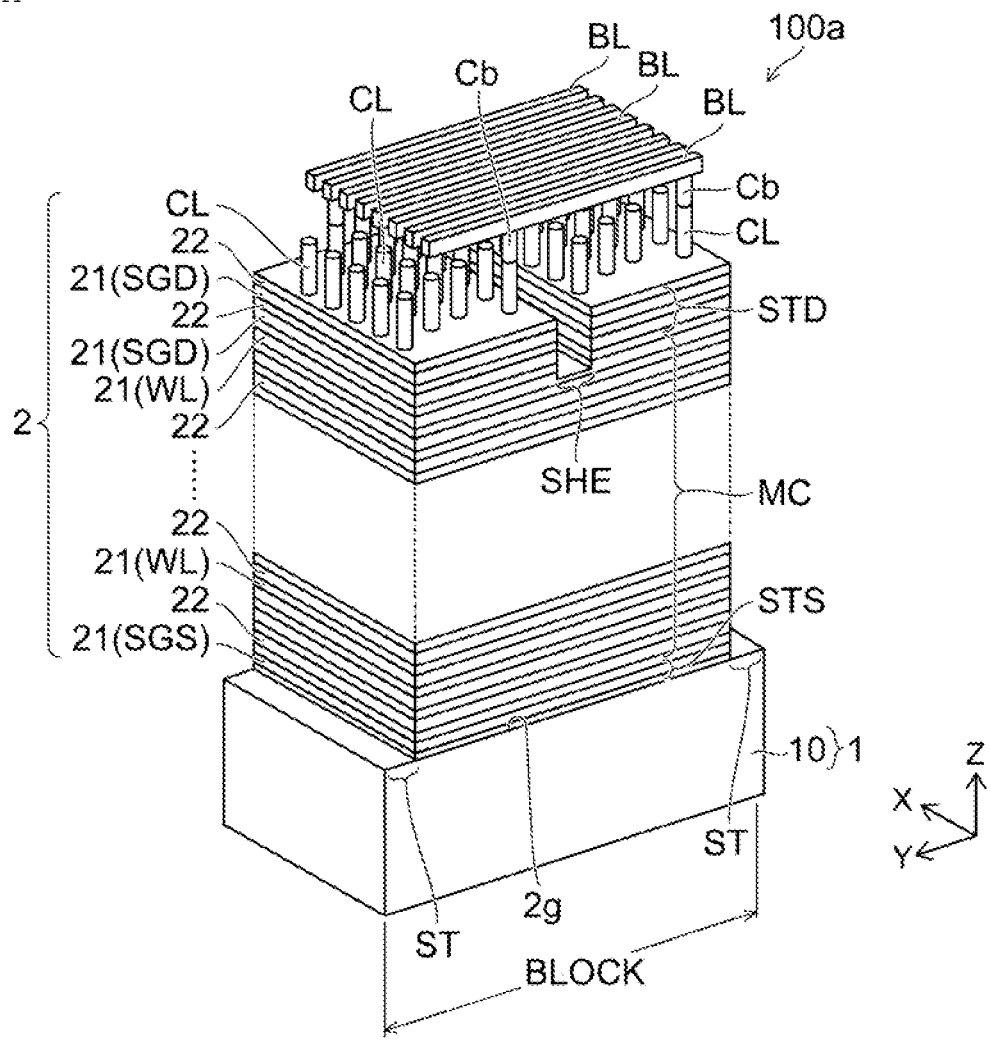
FIG. 1A is a schematic perspective view exemplifying a semiconductor device according to a first embodiment and FIG. 1B is a schematic plan view illustrating a stacked body.

Embodiments of the present disclosure provide a semiconductor device capable of achieving low resistance of a conductive layer in a stacked body.

In general, according to one embodiment, a semiconductor device includes a base having a semiconductor region, and a stacked body having a plurality of alternating conductive layers and insulating layers located one over the other in a first direction over the semiconductor region of the base body, and a plate-shaped portion of at least a first insulating material extending through the stacked body in the first direction from an upper end of the stacked body to the base body and in a second direction crossing the first direction and in contact with the semiconductor region. A first columnar portion having a first semiconductor portion and a first memory film having a first charge-trapping portion extend through the stacked body in the first direction from the upper end of the stacked body to the base body, and the first semiconductor portion contacts the semiconductor region of the base body such that the first charge-trapping portion is located between the first semiconductor portion layer and at least one of the conductive layers in the stacked body. A second columnar portion having a second semiconductor portion and a second memory film having a second charge-trapping portion extend through the stacked body in the first direction from the upper end of the stacked body to the base body, such that the second semiconductor portion contacts the semiconductor region of the base body and the second charge-trapping portion is located between the second semiconductor portion and at least one of the conductive layers in the stacked body. The second columnar portion is spaced from the first columnar portion in the second direction. A third columnar portion having a third semiconductor portion and a third memory film having a third charge-trapping portion extend through the stacked body in the first direction from the upper end of the stacked body to the base body, such that the third semiconductor portion contacts the semiconductor region of the base body and the third charge-trapping portion is located between the third semiconductor portion and at least one of the conductive layers in the stacked body. The third columnar portion is spaced from the first columnar portion and the second columnar portion in the second direction. The first, second and third columnar portions are aligned with each other in the second direction, and separated from one another by different pitch lengths, wherein the pitch between the first columnar portion and the second columnar portion has a first pitch length, and the pitch between the first columnar portion and the third columnar portion has a second pitch length of a length different than that of the first pitch.

Hereinafter, embodiments of the present disclosure will be described with reference to the drawings.

The drawings are schematic and conceptual. A relationship between the thickness and the width of each portion, the size ratio between portions, and the like are not necessarily the same as an actual relationship, size ratio, and the like in a device. Dimensions or a ratio of the same portions are different depending on the drawings in some cases. In the present specification and each drawing, the same reference numerals are given to the same elements described in the described drawings and the detailed description thereof will not be repeated unless necessary.

First Embodiment

Figure 1B:
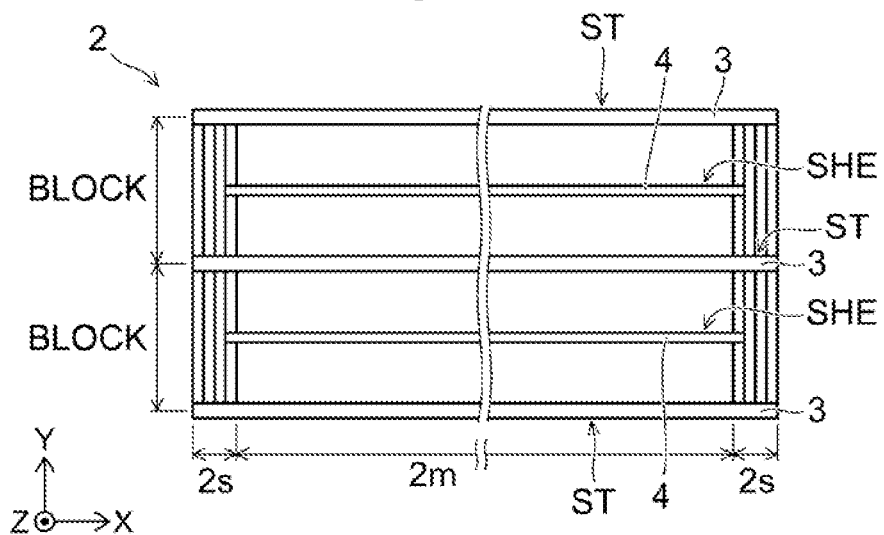
Figure 2A:
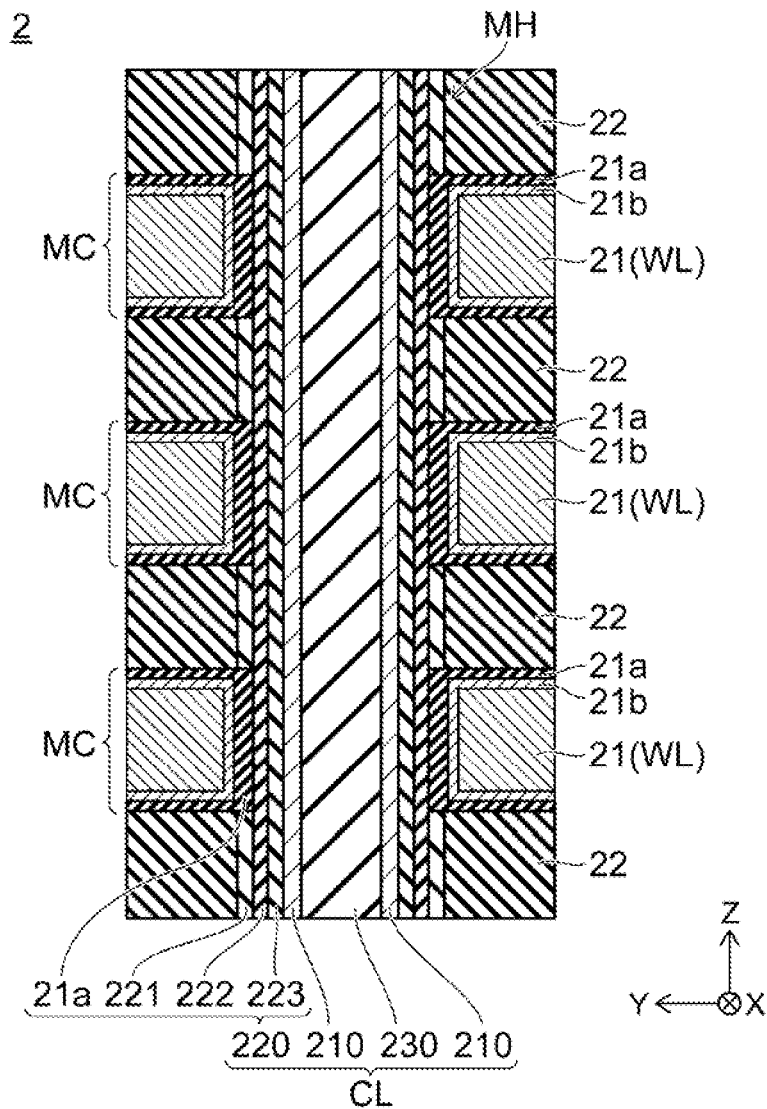
FIGS. 2A and 2B are schematic sectional views exemplifying a memory cell with a 3-dimensional structure.
Figure 2B:
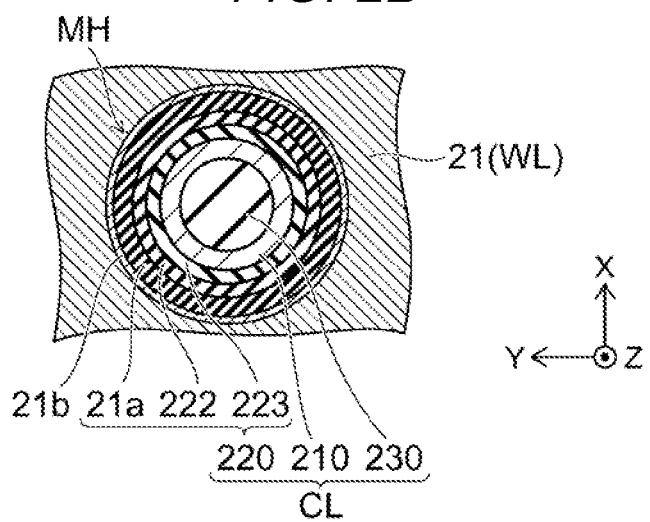
Figure 3A:
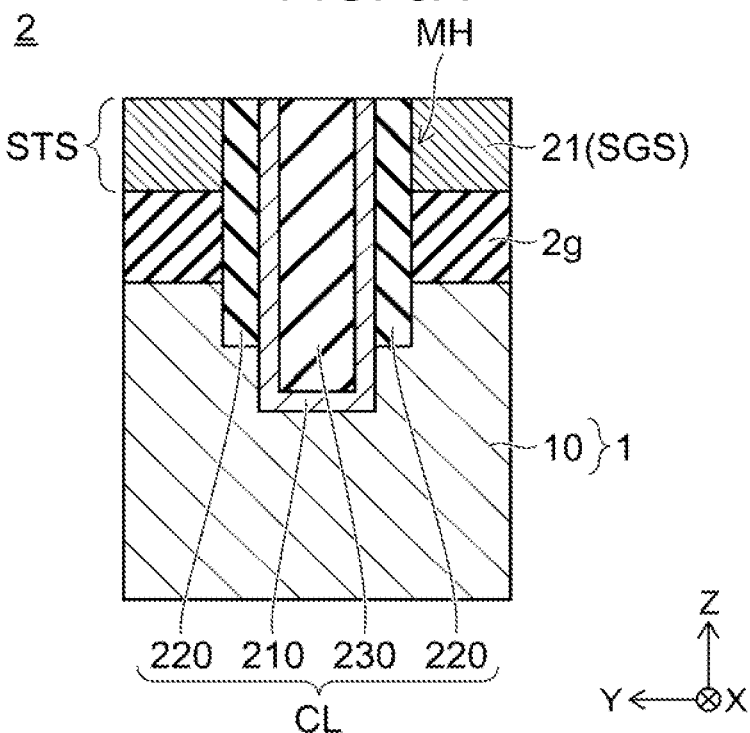
FIGS. 3A and 3B are schematic sectional views exemplifying a source-side select transistor.
Figure 3B:
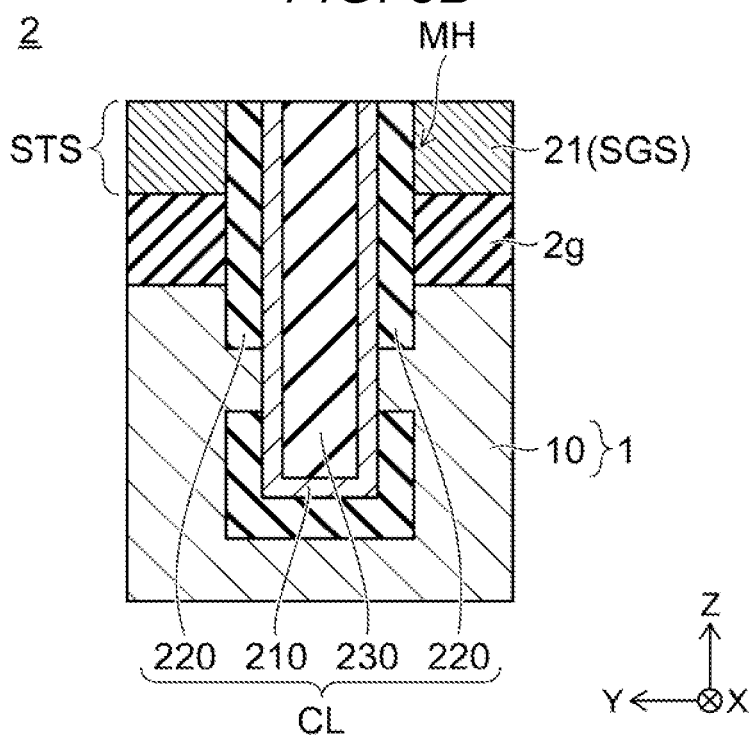

FIG. 1A is a schematic perspective view exemplifying a semiconductor device 100a according to a first embodiment. FIG. 1B is a schematic plan view illustrating a stacked body 2. FIGS. 2A and 2B are schematic sectional views exemplifying a memory cell MC with a 3-dimensional structure. FIG. 2A illustrates the Y-Z cross section and FIG. 2B illustrates the X-Y cross section. FIGS. 3A and 3B are schematic sectional views exemplifying a source-side select transistor STS. FIGS. 3A and 3B illustrate the Y-Z cross section. In the present specification, a Z axis direction is assumed to be the stacked direction. A first direction that is one direction intersecting the Z axis direction, for example, orthogonal to the Z axis direction, is assumed to an X axis direction. A second direction that is one direction intersecting the Z and X axes, for example, orthogonal to the Z and X axes, respectively, is assumed to be a Y axis direction.

As illustrated in FIGS. 1A to 3B, the semiconductor device 100a according to the first embodiment is a nonvolatile memory that includes a memory cell MC with a 3-dimensional structure. The semiconductor device 100a includes a base body 1, a stacked body 2, a plate-shaped portion 3, and a plurality of columnar portions CL.

The base body 1 includes a semiconductor region 10, which is for example a semiconductor substrate. The semiconductor region contains, for example, p-type silicon.

The stacked body 2 is provided on the base body 1. For example, an insulating film 2g is provided between the stacked body 2 and the semiconductor substrate 1. The stacked body 2 includes a plurality of conductive layers 21 and a plurality of insulating layers 22 alternately stacked one over the other in the Z axis direction. The conductive layer 21 contains, for example, tungsten (W). The insulating layer contains, for example, a silicon oxide ($SiO_2$). The insulating layer 22 insulates the conductive layers 21 from each other. Any number of stacked conductive layers 21 and any related number of stacked insulating layers 22 can be used. The insulating layer 22 may be, for example, a gap.

The conductive layer 21 includes at least one source-side selection gate SGS, a plurality of word lines WL, and at least one drain-side selection gate SGD. The source-side selection gate SGS is a gate electrode of a source-side select transistor STS. The word line WL is a gate electrode of the memory cell MC. The drain-side selection gate SGD is a gate electrode of a drain-side select transistor STD. The source-side selection gate SGS is provided in a lower region of the stacked body 2. The drain-side selection gate SGD is provided on an upper region of the stacked body 2. The lower region is a region of the stacked body 2 closer to the base body 1 and the upper region is a region of the stacked body 2 distant from the base body 1. The word line WL is provided between the source-side selection gate SGS and the drain-side selection gate SGD.

Among the plurality of insulating layers 22, for example, the thickness of the insulating layer 22 that insulates the source-side selection gate SGS from the word line WL in the Z axis direction may be formed to be thicker than the thickness of the insulating layer 22 that insulates a word line WL from another word line WL in the Z axis direction. Further, a cover insulating film may be provided on the insulating layer 22 of the top layer furthest from the semiconductor substrate which is the base body 1. The cover insulating film contains, for example, silicon oxide.

The semiconductor device 100a includes the plurality of memory cells MC connected in series between the source-side select transistor STS and the drain-side select transistor STD. A structure in which the source-side select transistor STS, the memory cells MC, and the drain-side select transistor STD are connected in series is referred to as a "memory string" or a "NAND string." The memory string is connected to, for example, bit lines BL via contacts Cb. The bit lines BL are provided above the stacked body 2 and extend in the Y axis direction.

Inside the stacked body 2, a plurality of deep slits ST and a plurality of shallow slits SHE are provided. The deep slits ST extend in the X axis direction intersecting the stack direction and are provided inside the stacked body 2 to penetrate through the stacked body 2 from the upper end of the stacked body 2 to the base body 1 in the z axis direction. The plate-shaped portion 3 is provided inside the deep slit ST. The plate-shaped portion 3 includes, for example, at least a first insulator. The first insulator is, for example, silicon oxide ($SiO_2$). The plate-shaped portion 3 may be electrically insulated from the stacked body 2 by the first insulator and include a first conducting material electrically connected to the semiconductor region 10. The shallow slits SHE extend in the X axis direction and are provided inside the stacked body 1 from the upper end of the stacked body 2 to an intermediate location in the z axis direction within the stacked body 2. For example, a second insulator 4 is provided inside the shallow slit SHE. The second insulator 4 is, for example, silicon oxide ($SiO_2$).

The stacked body 2 includes a memory cell array 2m and stair portions 2s provided on opposed ends of the stacked body 2 in the X axis direction (see FIG. 1B). The deep slit ST is provided from one stair portion 2s of the stacked body 2 through the memory cell array 2m to the other stair portion 2s. The shallow slit SHE is provided at least in the memory cell array 2m.

The stacked body 2 between the plate-shaped portions 3 is referred to as a "block (BLOCK)" and forms a minimum unit of data erasing. The second insulator 4 is provided inside the block. The portion of the stacked body 2 between the plate-shaped portion 3 and the second insulator 4 is referred to as a finger. A drain-side selection gate SGD is provided for each finger. In data writing and reading, one finger inside the block can transition to a selected state by operation of the drain-side selection gate SGD.

Each of the plurality of columnar portions CL is provided inside its own memory hole MH provided inside the stacked body 2. The memory hole MH is provided inside the stacked body 2 and extends through the stacked body 2 from the upper end of the stacked body 2 to the base body 1 in the Z axis direction. In the first embodiment, the memory hole MH extends through the stacked body 2 to reach the semiconductor region 10. Each of the columnar portions CL includes a semiconductor layer 210 in contact with the semiconductor region 10 (FIGS. 3A, 3B), a memory film 220 that includes a charge-trapping portion between the semiconductor layer 210 and the conductive layer 21, and a core layer 230 (see FIGS. 2A and 2B). The semiconductor layer 210 has a side surface and a bottom surface. A part of the side surface as well as the bottom surface of the semiconductor layer 210 may be in contact with the semiconductor region 10 (see FIG. 3A) or only a part of the side surface of the semiconductor layer 210 may be in contact with the semiconductor region 10 (see FIG. 3B).

The cross sectional shape of the memory hole MH in the X-Y plane is circular or elliptical. A block insulating film 21a that forms a part of the memory film 220 may be provided between the conductive layer 21 and the insulating layer 22. The block insulating film 21a is, for example, a silicon oxide film or a metal oxide film. One example of the metal oxide is aluminum oxide. A barrier film 21b may be provided between the conductive layer 21 and the insulating layer 22 and between the conductive layer 21 and the memory film 220. As the barrier film 21b, a stacked structure film of titanium nitride and titanium is used, for example, when the conductive layer 21 is tungsten. The block insulating film 21a prevents back-tunneling of charge from the conductive layer 21 to the memory film 220. The barrier film 21b improves adhesion of the conductive layer 21 to the block insulating film 21a.

The semiconductor layer 210 has, for example, a cylindrical shape with a bottom portion extending across the lower end of the core layer 230. The semiconductor layer 210 contains, for example, silicon. The silicon is, for example, polysilicon formed by crystallizing amorphous silicon. A conductivity type of the silicon is, for example, p-type. The semiconductor layer 210 serves as a channel of each of the drain-side select transistor STD, the memory cell MC, and the source-side select transistor STS.

In the memory film 220, a portion thereof is provided between the semiconductor layer 210 and an inner wall of the memory hole MH with the block insulating film therebetween. The memory film 220 has, for example, an annular shape. The plurality of memory cells MC is disposed between the semiconductor layer 210 and the conductive layer 21 serving as the word line WL and is stacked in the Z axis direction. The memory film 220 includes a cover insulating film 221, a charge-trapping film 222, and a tunnel insulating film 223. The semiconductor layer 210, the charge-trapping film 222, and the tunnel insulating film 223 each extend in the Z axis direction.

The cover insulating film 221 is provided between the insulating layer 22 and the charge-trapping film 222. The cover insulating film 221 contains, for example, silicon oxide. The cover insulating film 221 protects the charge-trapping film 222 so that the charge-trapping film 222 is not etched when a sacrificial film (not illustrated) is replaced with the conductive layer 21 (a replacing process). The cover insulating film 221 may be removed between the conductive layer 21 and the memory film 220 in the "replacing process." In this case, as illustrated in FIGS. 2A and 2B, for example, the block insulating film 21a is provided between the conductive layer 21 and the charge-trapping film 222. The cover insulating film 221 need not be provided when the "replacing process" is not used in forming of the conductive layer 21.

The charge-trapping film 222 is provided between the block insulating film 21a and the tunnel insulating film 223, and between the cover insulating film 221 and the tunnel insulating film 223. The charge-trapping film 222 contains, for example, a silicon nitride and includes a trap site that traps charges in the film. In the charge-trapping film 222, a portion interposed between the semiconductor layer 210 and the conductive layer 21 serving as the word line WL functions as the charge-trapping portion. A threshold voltage of the memory cell MC varies depending on whether there is a charge in the charge-trapping portion or an amount of charge trapped in the charge-trapping portion. Thus, the memory cell MC retains information. The charge-trapping film 222 may be a conductive film with a circumference surrounded by an insulating film so that the memory film 220 may have a floating structure.

The tunnel insulating film 223 is provided between the semiconductor layer 210 and the charge-trapping film 222. The tunnel insulating film 223 contains, for example, silicon oxide, or silicon oxide and silicon nitride. The tunnel insulating film 223 is a potential barrier between the semiconductor layer 210 and the charge-trapping film 222. Electrons or holes tunnel through the tunnel insulating film 223 when electrons are injected into the charge-trapping portion from the semiconductor layer 210 (a write operation) and when holes are injected into the charge-trapping portion from the semiconductor layer 210 (erasing operation), respectively.

The core layer 230 is embedded in the cylindrical semiconductor layer 210. The core layer 230 has, for example, a columnar shape. The core layer 230 contains, for example, silicon oxide and has an insulation property.

Figure 4A:
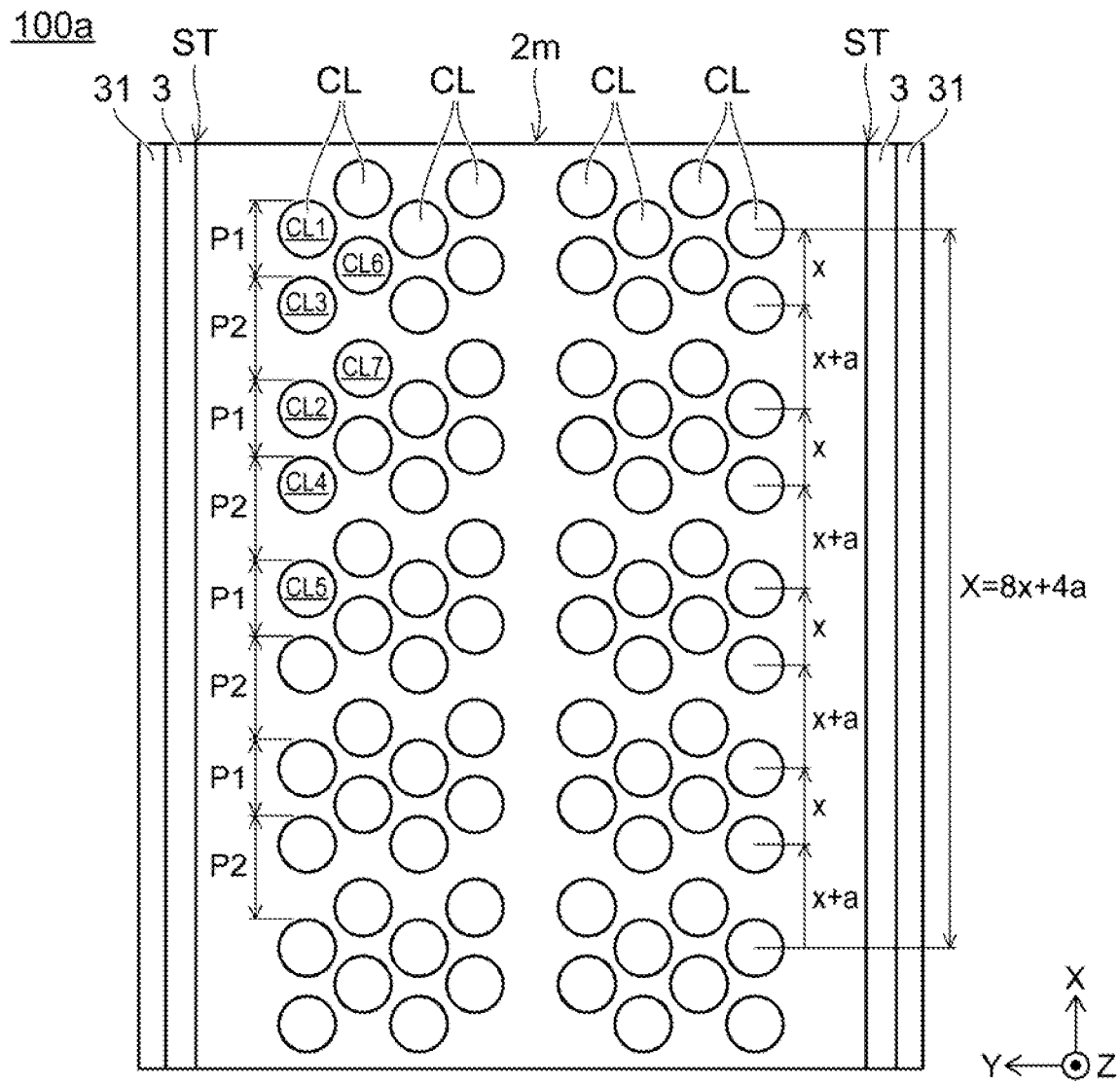
FIGS. 4A to 4C are schematic plan views exemplifying a semiconductor device according to the first embodiment.
Figure 4B:
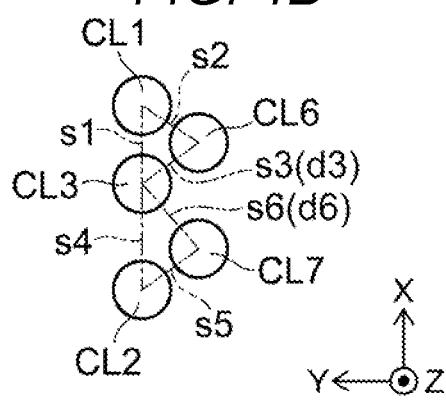
Figure 4C:
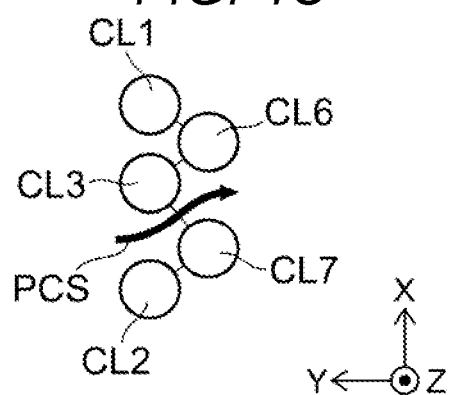

FIGS. 4A to 4C are schematic plan views exemplifying the semiconductor device 100a according to the first embodiment. FIGS. 4A to 4C illustrate the X-Y plane of the memory cell array 2m. In plan views subsequent to FIG. 4A, the shallow slits SHE are not illustrated.

The plurality of columnar portions CL is provided inside the stacked body 2. The columnar portions CL are arranged in, for example, a staggered arrangement in the memory cell array 2m.

Three first to third columnar portions CL1 to CL3 aligned in the X axis direction, as illustrated in FIG. 4A, are here focused on. In the present specification, for example, the term "aligned" in the X axis direction means that centers of the first to third columnar portions CL1 to CL3 are arranged in a straight line in the X axis direction.

The second columnar portion CL2 is spaced from the first columnar portion CL1 in the X axis direction. The third columnar portion CL3 is located between the first columnar portion CL1 and the second columnar portion CL2 and is aligned with the first columnar portion CL1 and the second columnar portion CL2 in the X axis direction.

In the semiconductor device 100a, a first pitch P1 between the first columnar portion CL1 and the third columnar portion CL3 is different from a second pitch P2 between the second columnar portion CL2 and the third columnar portion CL3. For example, the second pitch P2 is larger than the first pitch P1. In the present specification, a "pitch" is assumed to be a length from a tangent perpendicular to the Y axis direction on a side of the circumference of one columnar portion CL (for example, CL1 or CL2) and a tangent perpendicular to the Y axis direction on the same side of the circumference of another columnar portion CL (for example, CL3) aligned with the one columnar portion CL in the X axis direction and adjacent to the one columnar portion.

Inside the memory cell array 2m, the first pitch P1 and the second pitch P2 are provided in zigzag fashion in the Y axis direction from the deep slit ST to the deep slit ST, i.e., in adjacent columns of the tops of the columnar portions in the Y axis direction, the locations of the pitch P1 and P2 alternately change in the plus X and minus X direction. For columns spaced at the second pitch P2, the distance in the X-axis direction between side surfaces of the columnar portions CL is larger than that for columns separated at the first pitch P1. Therefore, for example, it is possible to obtain the advantage of easily forming the conductive layers 21 when the conductive layers 21 (see FIGS. 2A and 2B) are formed by replacing sacrifice films (not illustrated). As a result, in the semiconductor device 100a, it is possible to achieve low resistance of the conductive layers 21 in the stacked body 2.

Figure 5A:
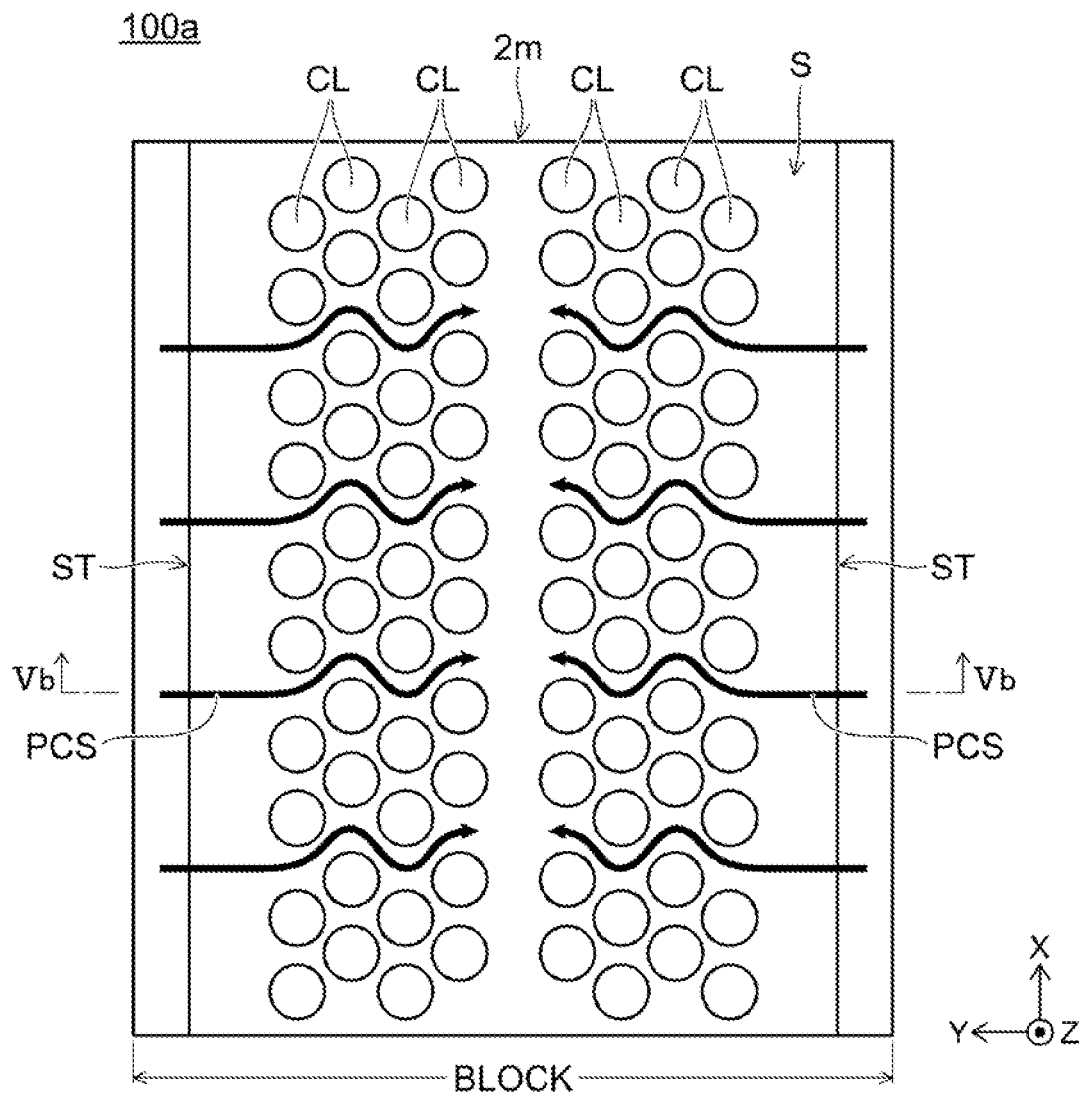
FIG. 5A is a schematic sectional view exemplifying a process of fabricating the semiconductor device according to the first embodiment and FIG. 5B is a schematic sectional view taken along the line V-V of FIG. 5A.
Figure 5B:
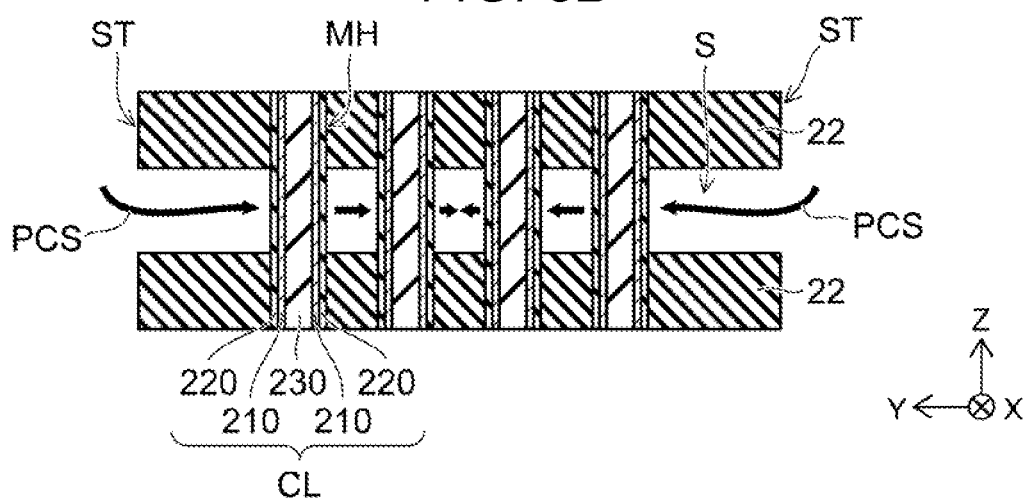

FIG. 5A is a schematic sectional view exemplifying a process of fabricating the semiconductor device 100a according to the first embodiment. FIG. 5B is a schematic sectional view taken along the line V-V of FIG. 5A. FIG. 5A illustrates the X-Y cross section. FIG. 5B illustrates the Y-Z cross section.

As illustrated in FIGS. 5A and 5B, in the semiconductor device 100a, for example, a space S is formed between the insulating layers 22 in the fabricating process. The space S is formed by forming a sacrifice film (not illustrated) between the insulating layers 22 and removing the sacrifice film between the insulating layers 22. In the space S, a material gas for forming the conductive layers, for example, a gas PCS containing a metal precursor, is sent thereto via the deep slit ST. The metal precursor is decomposed, for example, thermally decomposed in the space S. As a result, a metal film serving as the conductive layer 21 grows on the surface of the insulating layer 22 exposed to the upper and lower portions of the space S and the side surface of the columnar portion CL extending in the Z axis direction inside the space S (see FIGS. 2A and 2B).

The gas PCS containing the metal precursor cannot be sent in the space S when for example, a spot located between the side surfaces of the columnar portions CL in the space S becomes blocked by the metal film being formed and a space where the metal film is resultantly less thick is formed behind the blockage. Then, the growth of the metal film is stopped.

In the semiconductor device 100a, in the region of the second pitch P2, the distance between the side surfaces of the columnar portions CL is larger than that in the region of the first pitch P1. Therefore, in the region of the second pitch P2, it is difficult for the metal film to block the location between the side surfaces of the columnar portions CL. The gas PCS containing the metal precursor can be sent to a location deep in the space S from the slit, for example, a central region of the block (BLOCK), for a long time before the space is spanned and further flow is blocked. Accordingly, in the semiconductor device 100a, it is possible to grow a metal film with a greater thickness in the Z axis direction in the central region of the block (BLOCK). By causing the thickness of the metal film to be thick in the central region of the block (BLOCK), it is possible to prevent an increase in a resistant value of the conductive layer 21 and achieve low resistance of the conductive layer 21 in the stacked body 2.

In the semiconductor device 100a, the region of the first pitch P1 and the region of the second pitch P2 alternately occur in the memory cell array 2m. In the arrangement pattern, the columnar portions CL are disposed inside the stacked body 2, as will be described below. In FIG. 4A, a fourth columnar portion CL4 and a fifth columnar portion CL5 are further focused on.

The fourth columnar portion CL4 is aligned with the first to third columnar portions CL1 to CL3 in the X axis direction. The fourth columnar portion CL4 is located adjacent to the second columnar portion CL2. The pitch between the second columnar portion CL2 and the fourth columnar portion CL4 is the first pitch P1. The fifth columnar portion CL5 is aligned with the first to fourth columnar portions CL1 to CL4 in the X axis direction. The fifth columnar portion CL5 is located adjacent to the fourth columnar portion CL4. The pitch between the fourth columnar portion CL4 and the fifth columnar portion CL5 is the second pitch P2.

In this way, by arranging the first to fifth columnar portions CL1 to CL5 inside the stacked body 2, it is possible to cause the region of the first pitch P1 and the region of the second pitch P2 to alternately occur in the memory cell array 2m.

To obtain the semiconductor device 100a, as will be described below, the columnar portions CL are disposed inside the stacked body 2.

A distance between the columnar portions CL in the X axis direction is assumed to be "x." In semiconductor devices of the related art, each distance between the columnar portions CL is uniform as "x." In the semiconductor device 100a, "x" and "x+a" are alternated as the distances between the columnar portions CL in the X axis direction. Thus, it is possible to obtain the semiconductor device 100a in which the region of the first pitch P1 and the region of the second pitch P2 are alternated in the memory cell array 2m.

Further, in the semiconductor device 100a, the columnar portions CL are arranged in the staggered arrangement in which the columnar portions CL are alternated in the memory cell array 2m. In the arrangement pattern, the columnar portions CL are disposed inside the stacked body 2, as will be described below. In FIG. 4A, a sixth columnar portion CL6 and a seventh columnar portion CL7 are further focused on.

The sixth columnar portion CL6 is shifted from the location of the first columnar portion CL1 and the third columnar portion CL3 in the X axis direction to be located between the first columnar portion CL1 and the third columnar portion CL3 in the Y axis direction. The seventh columnar portion CL7 is shifted from the location of the second columnar portion CL2 and the third columnar portion CL3 in the X axis direction to be located between the second columnar portion CL2 and the third columnar portion CL3 in the Y axis direction. The seventh columnar portion CL7 is aligned with the sixth columnar portion CL6 in the X axis direction.

On the X-Y plane, when central points of the first columnar portion CL1, the third columnar portion CL3, and the sixth columnar portion CL6 are bounded by an imaginary line, a "triangle" is formed. Similarly, when central points of the second columnar portion CL2, the third columnar portion CL3, and the seventh columnar portion CL7 are bounded by an imaginary line, a "triangle" is formed (see FIG. 4B). It is assumed that a first side s1 is a side connecting the centers of the first columnar portion CL1 and the third columnar portion CL3, a second side s2 is a side connecting the centers of the first columnar portion CL1 and the sixth columnar portion CL6, and a third side s3 is a side connecting the centers of the third columnar portion CL3 and the sixth columnar portion CL6. It is assumed that a fourth side s4 is a side connecting the centers of the second columnar portion CL2 and the third columnar portion CL3, a fifth side s5 is a side connecting the centers of the second columnar portion CL2 and the seventh columnar portion CL7, and a sixth side s6 is a side connecting the centers of the third columnar portion CL3 and the seventh columnar portion CL7.

In the semiconductor device 100a, the length of the sixth side s6 is different from the length of the third side s3. For example, the length of the sixth side s6 is longer than the length of the third side s3. Each of the lengths of the first side s1 to the sixth side s6 indicates a distance between the centers of the columnar portions CL. In the semiconductor device 100a, the sixth columnar portion CL6 is spaced from the third columnar portion CL3 by a third distance d3 (=s3) and the seventh columnar portion CL7 is spaced from the third columnar portion CL3 by a sixth distance d6 (=s6).

The sixth distance d6 is longer than the third distance d3. Therefore, even when a gap between the third columnar portion CL3 and the sixth columnar portion CL6 is blocked by, for example, a metal film, a gap between the third columnar portion CL3 and the seventh columnar portion CL7 can remain unblocked. Accordingly, the gas PCS containing the metal precursor can be flowed in the space S via the gap between the third columnar portion CL3 and the seventh columnar portion CL7 (see FIG. 4C).

The "triangle" depicted on the X-Y plane by the first columnar portion CL1, the third columnar portion CL3, and the sixth columnar portion CL6 may be an isosceles triangle. In this case, the length of the first side s1 is different from the length of the second side s2. The length of the second side s2 is the same as the length of the third side s3. The "triangle" may be an equilateral triangle. In this case, the lengths of the first side s1 to the third side s3 may be the same as each other. The "triangle" may be a scalene triangle. In this case, the lengths of the first side s1 to the third side s3 are different from each other. In each triangle, the length (=d3) of the third side s3 is different from the length (=d6) of the sixth side s6. For example, the length of the sixth side s6 is longer than the length of the third side s3. Thus, even when the gap between the third columnar portion CL3 and the sixth columnar portion CL6 is blocked by, for example, a metal film, the gap between the third columnar portion CL3 and the seventh columnar portion CL7 can remain unblocked.

A "triangle" depicted on the X-Y plane by the second columnar portion CL2, the third columnar portion CL3, and the seventh columnar portion CL7 is a scalene triangle. The lengths of the fourth side s4 to the sixth side s6 are different from each other. The length of the sixth side s6 is the longest.

Figure 6:
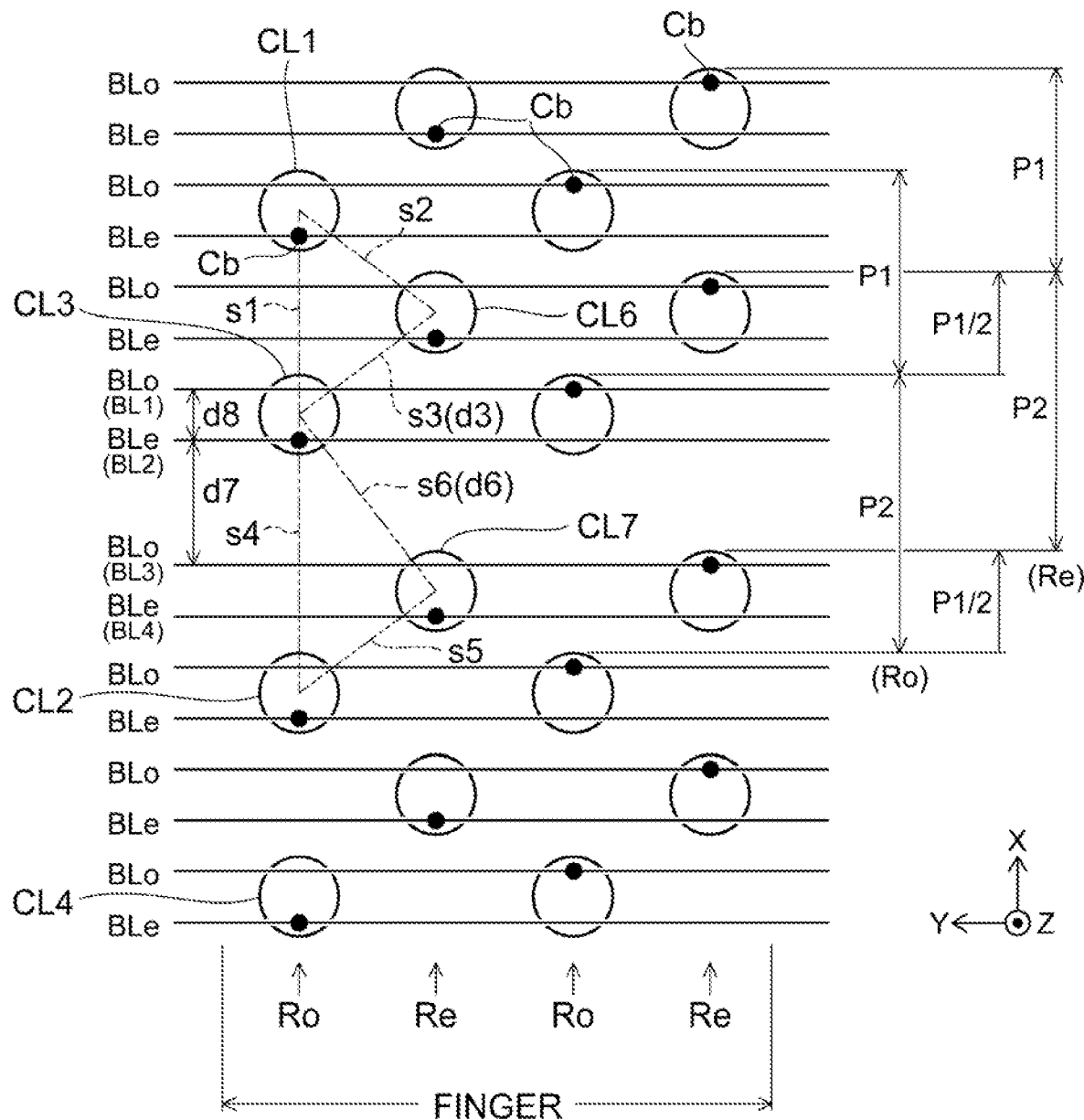
FIG. 6 is a schematic plan view exemplifying the semiconductor device according to the first embodiment.

FIG. 6 is a schematic plan view exemplifying semiconductor device 100a according to the first embodiment. FIG. 6 illustrates a relation between the bit lines BL and the columnar portions CL in one finger (FINGER).

As illustrated in FIG. 6, for example two bit lines BL are disposed above each of the first columnar portion CL1, second columnar portion CL2 and the third columnar portion CL3, the sixth columnar portion CL6, and the seventh columnar portion CL7. One of the two bit lines BL is referred to as an odd bit line BLo and the other of the two bit lines BL is referred to as an even bit line BLe. The odd bit lines BLo and the even bit lines BLe are alternately located and spaced in the X axis direction.

The third columnar portion CL3 and the seventh columnar portion CL7 are focused on here. Above the third columnar portion CL3, a bit line BL1 is disposed as the odd bit line BLo and a bit line BL2 is disposed as the even bit line BLe. Above the seventh columnar portion CL7, a bit line BL3 is disposed as the odd bit line BLo and a bit line BL4 is disposed as the even bit line BLe. The bit line BL2 is disposed between the bit line BL1 and the bit line BL3. The bit line BL2 is adjacent to each of the bit line BL1 and the BL3. A seventh distance d7 between the bit line BL2 and the bit line BL3 in the X axis direction is larger than an eighth distance d8 between the bit line BL1 and the bit line BL2 in the X axis direction. This is because the sixth distance d6 is larger than the third distance d3. In the semiconductor device 100a, the semiconductor device 100a includes, for example, regions with different distances between the bit lines BL according to the region of the first pitch P1 and the region of the second pitch P2.

In the semiconductor device 100a, for example, four columnar portions CL are arranged in zigzags in the Y axis direction in one finger (FINGER). This arrangement is repeated in the X axis direction. The arrangement of columnar portions in the X axis direction is referred to as a "row" for convenience.

In the semiconductor device 100a, for example, four "rows" are included in each finger. The four "rows" alternately include odd rows Ro and even rows Re. The first columnar portion CL1 to the fourth columnar portion CL4 belong to the odd rows Ro and the sixth columnar portion CL6 and the seventh columnar portion CL7 belong to the even rows Re.

Here, the length of the second side s2 is assumed to be the same as the length of the third side s3 in the "triangle" depicted on the X-Y plane by the first columnar portion CL1, the third columnar portion CL3, and the sixth columnar portion CL6. In this case, for example, the odd rows Ro and the even rows Re are shifted by "P1/2", i.e., one half of the first pitch distance, in the X axis direction.

In this way, it is possible to obtain the semiconductor device 100a in which, for example, the odd rows Ro and the even rows Re are shifted by "P1/2" in the X axis direction.

In the semiconductor device 100a, the reason why two bit lines are disposed above each columnar portion CL is that four columnar portions in one finger are arranged in zigzags in two columns along the Y axis direction in one finger. For example, when six columnar portions are arranged in zigzags in two columns in the Y axis directions in one finger, three bit lines are disposed above one columnar portion CL. The same applies to all of the embodiment and the modification examples described in the present specification.

First Embodiment: First Modification Example

Figure 7:
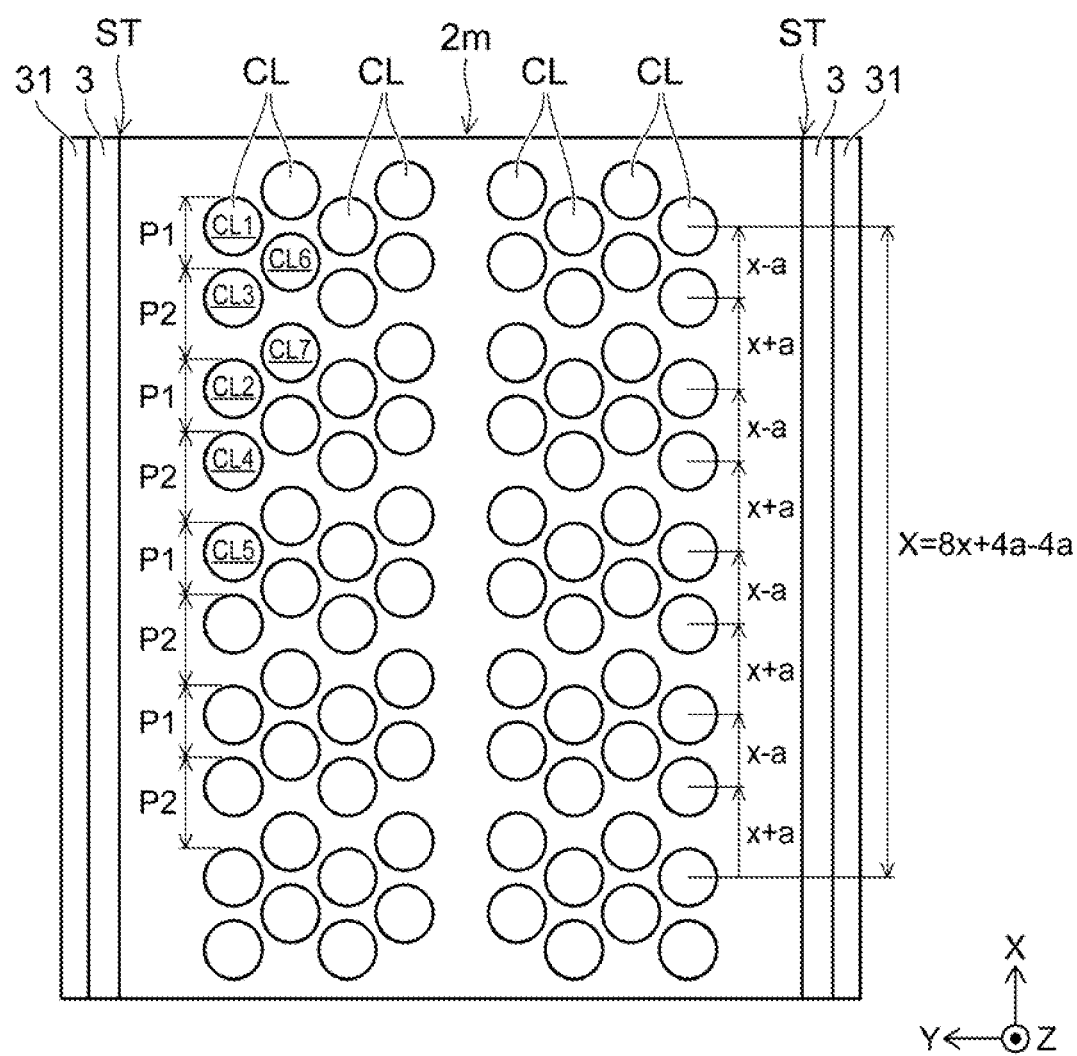
FIG. 7 is a schematic plan view exemplifying a semiconductor device according to a first modification example of the first embodiment.

FIG. 7 is a schematic plan view exemplifying a semiconductor device 100aa according to a first modification example of the first embodiment.

In the semiconductor device 100a, the region of the second pitch P2 is provided in the memory cell array 2m. Therefore, "x" and "x+a" are alternated as the distances between the columnar portions CL in the X axis direction. Therefore, the size of the memory cell array 2m in the X axis direction increases by, for example, an addition amount of an addition value "+a."

As illustrated in FIG. 7, in the semiconductor device 100aa according to the first modification example, "x−a" and "x+a" are alternated as the distances between the columnar portions CL in the X axis direction. Thus, the addition value "+a" can be offset with a subtraction value "−a."

In the semiconductor device 100aa, it is possible to further prevent the size of the memory cell array 2m from increasing in the X axis direction while obtaining the same advantages as those of the semiconductor device 100a.

First Embodiment: Second Modification Example

Figure 8A:
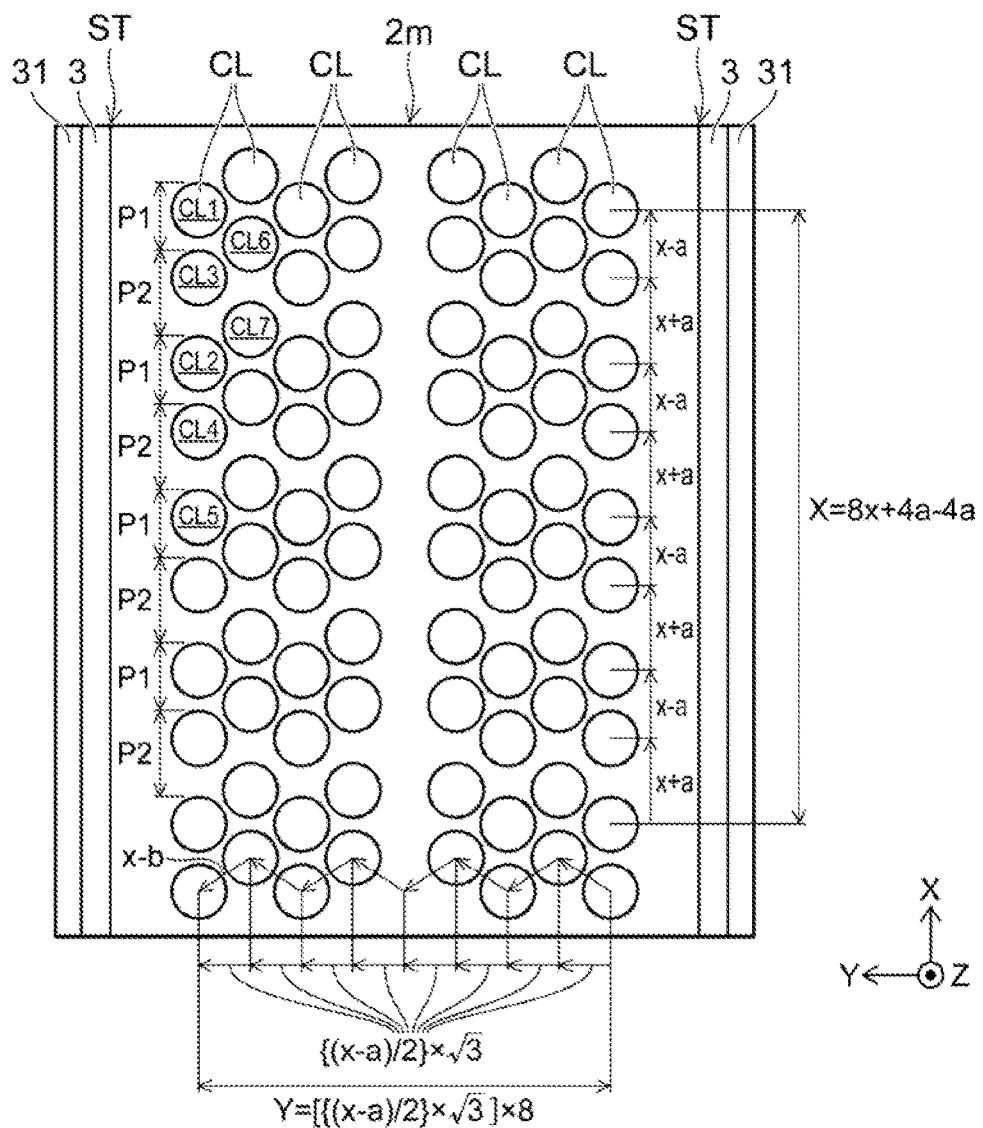
FIG. 8A is a schematic plan view exemplifying a semiconductor device according to a second modification example of the first embodiment.
Figure 8B:
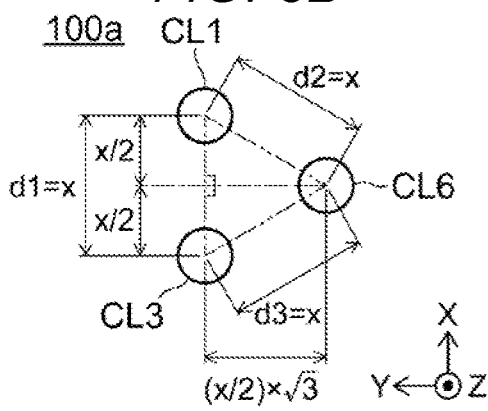
FIG. 8B is a schematic plan view exemplifying the semiconductor device according to the first embodiment.
Figure 8C:
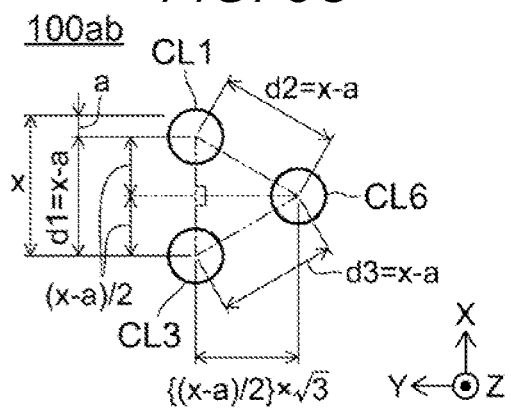
FIG. 8C is a schematic plan view exemplifying the semiconductor device according to the second modification example of the first embodiment.

FIG. 8A is a schematic plan view exemplifying a semiconductor device 100ab according to a second modification example of the first embodiment. FIG. 8B is a schematic plan view exemplifying the semiconductor device 100a according to the first embodiment. FIG. 8C is a schematic plan view exemplifying the semiconductor device 100*ab* according to the second modification example of the first embodiment.

As illustrated in FIG. 8A, in the semiconductor device 100*ab* according to the second modification example, the size of the memory cell array 2*m* in the Y axis direction is reduced. In the semiconductor device 100*ab*, the columnar portions CL are arranged in a staggered arrangement in the memory cell array 2*m*. Therefore, the columnar portions CL are arranged in zigzags in the Y axis direction.

As illustrated in FIG. 8B, for example, in the semiconductor device 100*a* according to the first embodiment, an equilateral triangle in which central points of the first columnar portion CL1, the third columnar portion CL3, and the sixth columnar portion CL6 are connected is assumed. The length of each side of the equilateral triangle is assumed to be "x." On this assumption, in the semiconductor device 100*a* according to the first embodiment, a first distance d1 between the central point of the first columnar portion CL1 and the central point of the third columnar portion CL3, a second distance d2 between the central point of the first columnar portion CL1 and the central point of the sixth columnar portion CL6, and a third distance d3 between the central point of the third columnar portion CL3 and the central point of the sixth columnar portion CL6 are each "x."

When the central portion of the first columnar portion CL1 and the third columnar portion CL3 are formed aligned in the X axis direction, the length from the central point of the first columnar portion CL1 in the Y axis direction to the central portion of the sixth columnar portion CL6 (the height of a right-angled triangle of which ratios of sides is 1:2:√3) or the length from the central point of the third columnar portion CL3 in the Y axis direction to the central portion of the sixth columnar portion CL6 (the height of a right-angled triangle of which ratios of sides are 1:2:√3) is "(x/2)×√3." That is, in the semiconductor device 100*a*, the distance between the columnar portions CL in the Y axis direction is, for example, "(x/2)×√3."

As illustrated in FIG. 8C, in the semiconductor device 100*ab*, for example, the subtraction value "−a" is further reduced from each of the first distance d1 to the third distance d3. Accordingly, in the semiconductor device 100*ab*, the distance between the columnar portions CL in the Y axis direction can be reduced from "(x/2)×√3" to, for example, "{(x−a)/2}×√3." The distance reduced in this way is repeated in the Y axis direction, for example, as illustrated in FIG. 8A, in the semiconductor device 100*ab*.

In this way, in the semiconductor device 100*ab*, for example, by further reducing the subtraction value "−a" from each of the first distance d1 to the third distance d3, it is possible to reduce the size of the memory cell array 2*m* in the Y axis direction.

The "triangle" in which central points of the first columnar portion CL1, the third columnar portion CL3, and the sixth columnar portion CL6 are connected is not limited to an "equilateral triangle." The "triangle" in which central points of the first columnar portion CL1, the third columnar portion CL3, and the sixth columnar portion CL6 are connected may be an "isosceles triangle" or may be a "scalene triangle." Accordingly, a subtraction value for the second distance d2 and the third distance d3 may not be based on the subtraction value "−a" in the X axis direction. A subtraction value different from the subtraction value "−a" may be given for the second distance d2 and the third distance d3 sloped in the X axis direction.

First Embodiment: Third Modification Example

Figure 9:
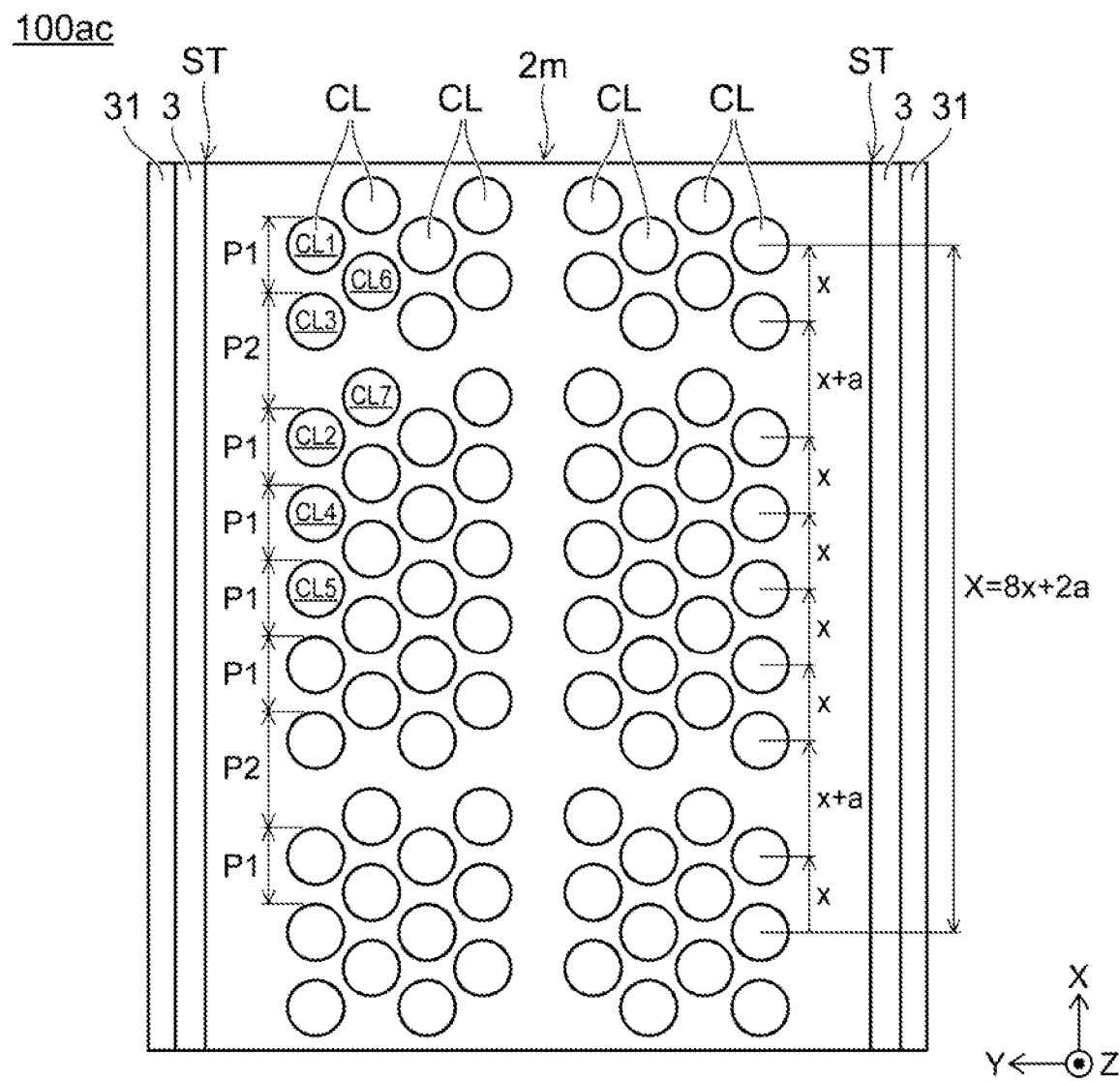
FIG. 9 is a schematic plan view exemplifying a semiconductor device according to a third modification example of the first embodiment.

FIG. 9 is a schematic plan view exemplifying a semiconductor device 100*ac* according to a third modification example of the first embodiment.

As illustrated in FIG. 9, in the semiconductor device 100*ac* according to the third modification example, a region of the first pitch P1 narrower than the second pitch P2 continuously appears in the memory cell array 2*m*. One example of the arrangement pattern of the columnar portions CL of the semiconductor device 100*ac* will be described below. In FIG. 9, the fourth columnar portion CL4 and the fifth columnar portion CL5 are further focused on.

The fourth columnar portion CL4 is aligned with the first columnar portion CL1 to the third columnar portion CL3 in the X axis direction. The fifth columnar portion CL5 is aligned with the first columnar portion CL1 to the fourth columnar portion CL4 in the X axis direction. The fourth columnar portion CL4 is located away from the second columnar portion CL2. The fifth columnar portion CL5 is spaced from the fourth columnar portion CL4. The pitch between the second columnar portion CL2 and the fourth columnar portion CL4 and the pitch between the fourth columnar portion CL4 and the fifth columnar portion CL5 are each the first pitch P1.

By arranging the first columnar portion CL1 to the fifth columnar portion CL5 inside the stacked body 2 in this way, the region of the first pitch P1 and the region of the second pitch P2 can alternately appear in the memory cell array 2*m*.

In the semiconductor device 100*ac*, a region having the first pitch narrower than the second pitch P2 continuously appears in the memory cell array 2*m*. In the semiconductor device 100*ac*, the ratio of the first pitch P1 to the second pitch P2 is set to 4:1. Thus, it is possible to further prevent the size of the memory cell array 2*m* in the X axis direction from increasing in the X axis direction than, for example, in the semiconductor device 100*a* according to the first embodiment.

Even in the semiconductor device 100*ac*, it is possible to arrange the columnar portions CL in the staggered arrangement inside the memory cell array 2*m* like the semiconductor device 100*a*.

First Embodiment: Fourth Modification Example

Figure 10:
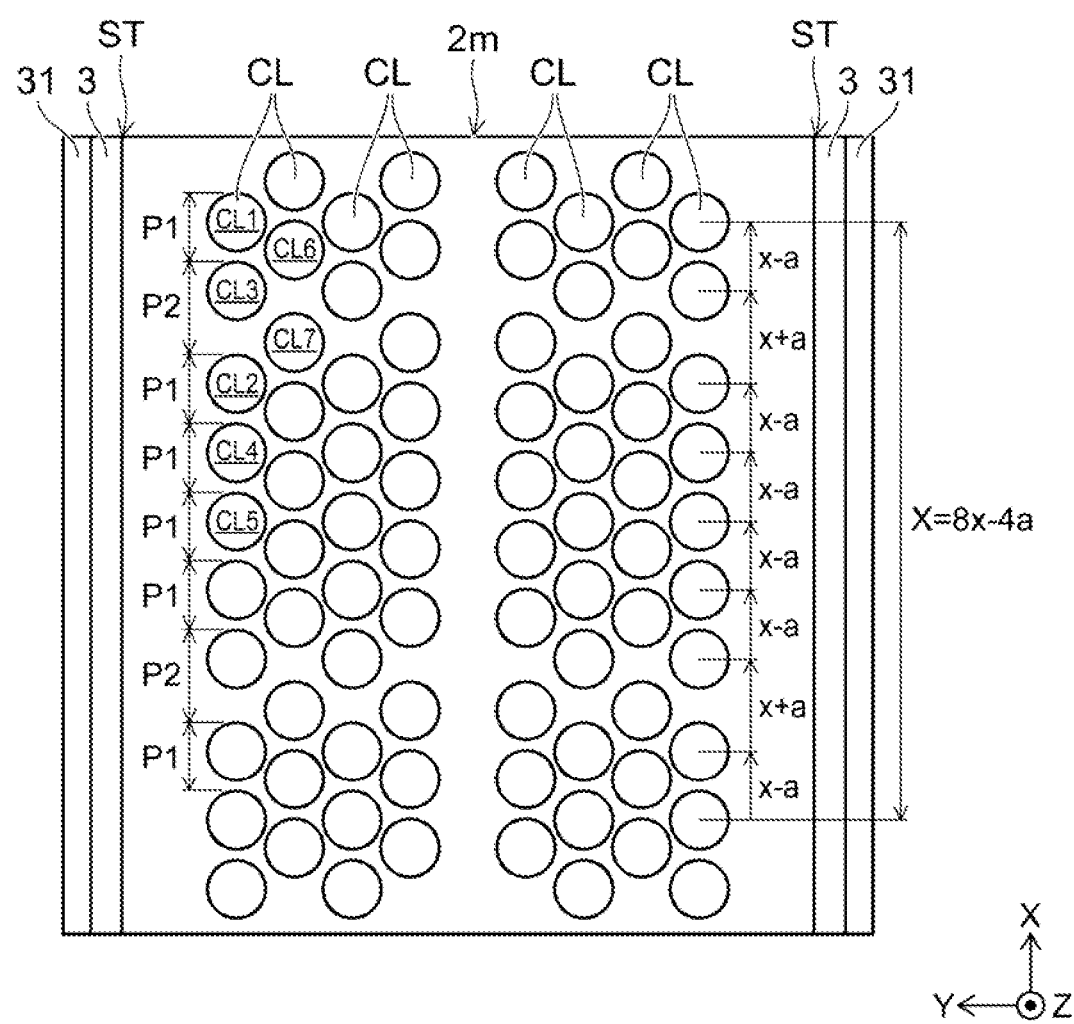
FIG. 10 is a schematic plan view exemplifying a semiconductor device according to a fourth modification example of the first embodiment.

FIG. 10 is a schematic plan view exemplifying a semiconductor device 100*ad* according to a fourth modification example of the first embodiment.

As illustrated in FIG. 10, the semiconductor device 100*ad* according to the fourth modification example is an example in which the first and third modification examples are combined.

In the semiconductor device 100*ad*, a region in which the pitch distance between the columnar portions CL in the X axis direction is "x−a" continues. Thus, it is possible to offset the addition value "+a" and the subtraction "−a" and it is possible to further reduce the size of the memory cell array 2*m* in the X axis direction by the repetition of the subtraction value "−a."

First Embodiment: Fifth Modification Example

Figure 11:
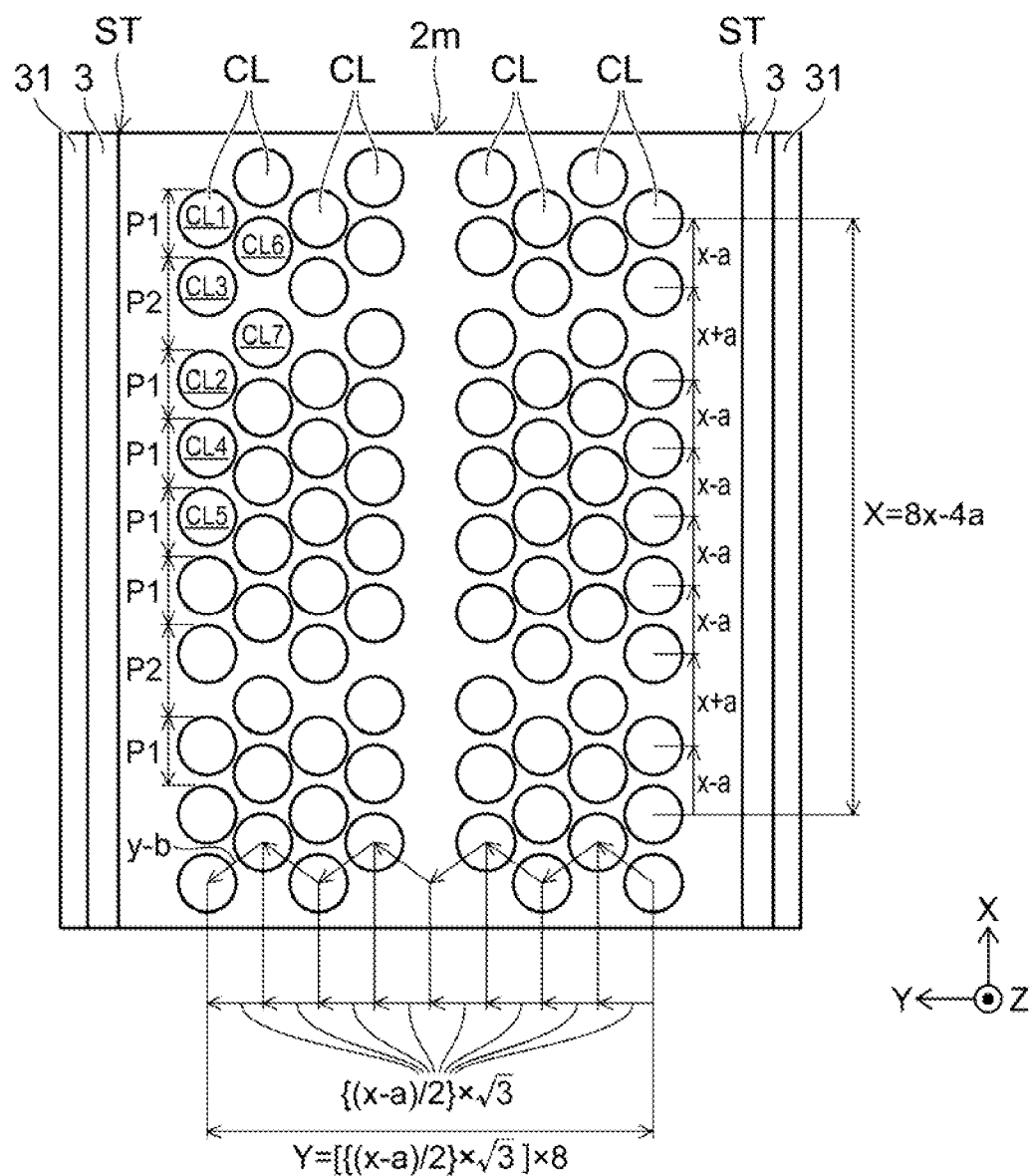
FIG. 11 is a schematic plan view exemplifying a semiconductor device according to a fifth modification example of the first embodiment.

FIG. 11 is a schematic plan view exemplifying a semiconductor device 100*ae* according to a fifth modification example of the first embodiment.

As illustrated in FIG. 11, the semiconductor device 100*ae* according to the fifth modification example is an example in which the second and fourth modification examples are combined.

In the semiconductor device 100*ae*, a region in which the pitch distance between the columnar portions CL in the X axis direction is "x−a" is continuous and, for example, "−a" is further reduced from, for example, each of the first distance d1 to the third distance d3. Thus, it is possible to further reduce the size of the memory cell array 2*m* in the X axis direction and the Y axis direction.

Second Embodiment

Figure 12:
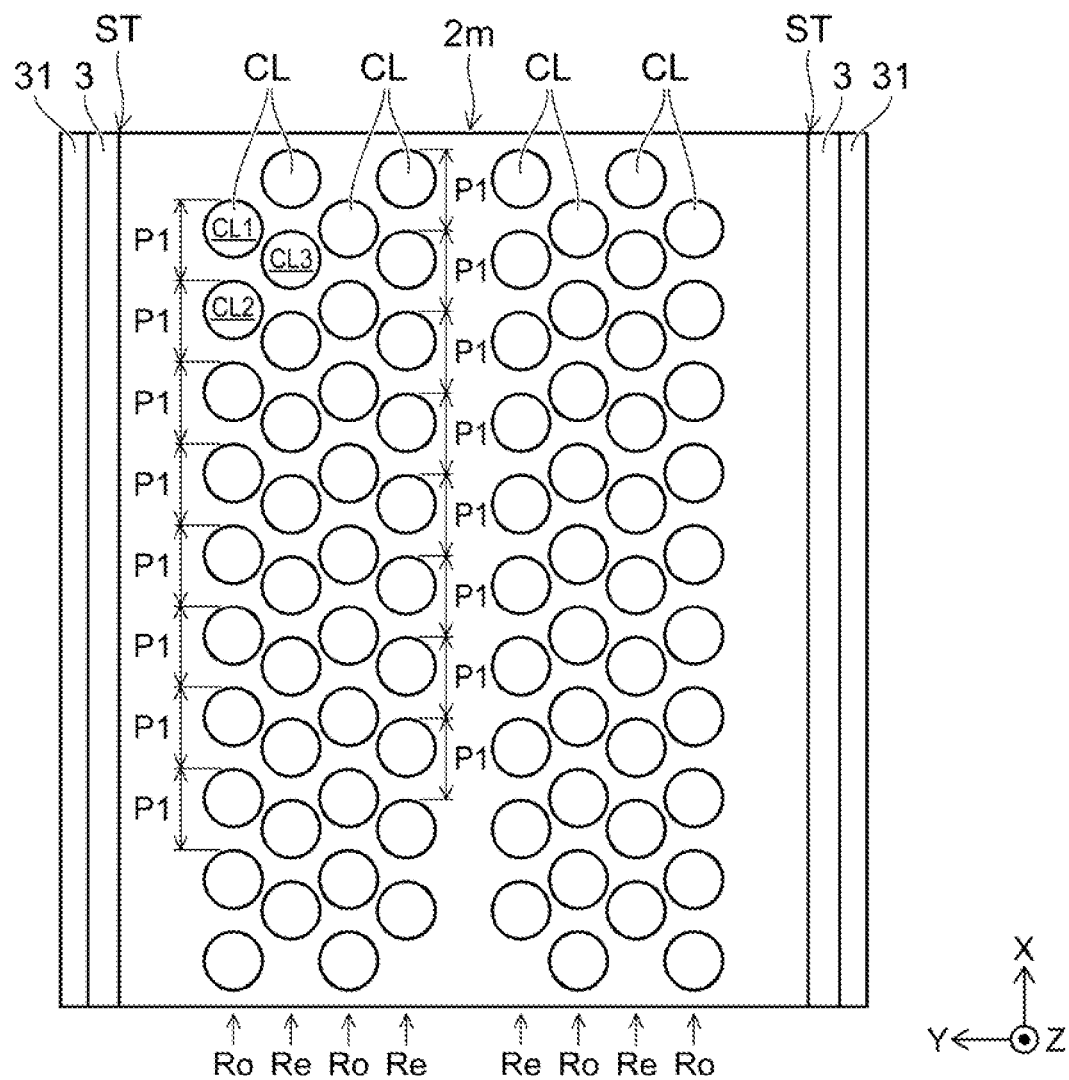
FIG. 12 is a schematic plan view exemplifying a semiconductor device according to a second embodiment.
Figure 13:
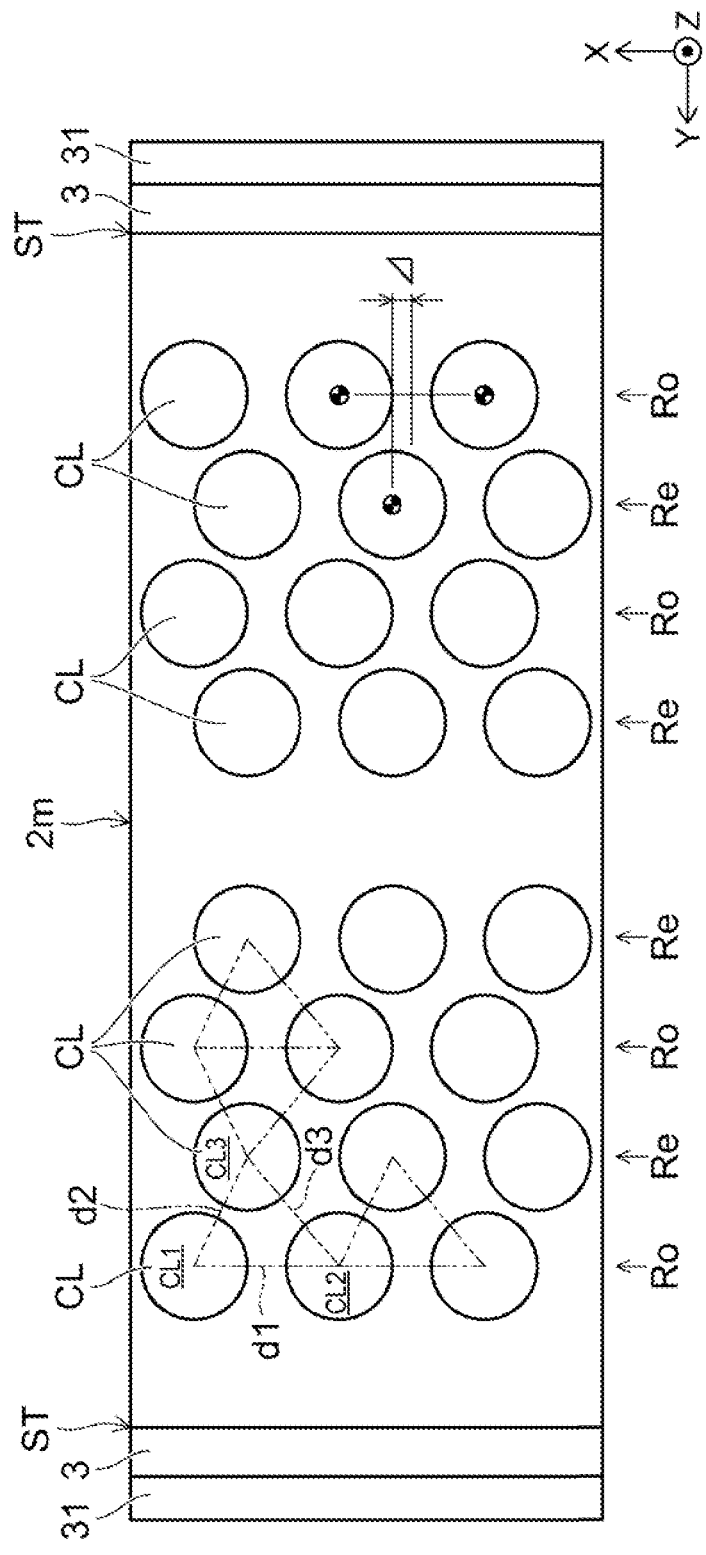
FIG. 13 is a schematic plan view exemplifying the semiconductor device according to the second embodiment.

FIGS. 12 and 13 are schematic plan views exemplifying a semiconductor device 100*b* according to a second embodiment.

As illustrated in FIGS. 12 and 13, two first columnar portions CL1 and second columnar portions CL2 arranged in the X axis direction and a third columnar portion CL3 shifted from each of the first columnar portion CL1 and the second columnar portion CL2 in the Y axis direction are focused on here.

In the semiconductor device 100*b* according to the second embodiment, the second columnar portion CL2 is spaced from the from the first columnar portion CL1 in the X axis direction. The second columnar portion CL2 is spaced from the first columnar portion by the first distance d1 in the X axis direction. The third columnar portion CL3 is located between the first columnar portion CL1 and the second columnar portion CL2 in the x axis direction and is shifted from the first columnar portion CL1 and the second columnar portion CL2 in the Y axis direction. The third columnar portion CL3 is spaced from the first columnar portion CL1 by the second distance d2. The second distance d2 is different from the first distance d1. Further, the third columnar portion CL3 is spaced away from the second columnar portion CL2 by the third distance d3. The third distance d3 is different from each of the first distance d1 and the second distance d2.

In the semiconductor device 100*b*, the pitch between the columnar portions CL in the X axis direction is repeated as the first pitch P1 inside the memory cell array 2*m*. Then, in the semiconductor device 100*b*, a "triangle" in which central points of the first columnar portion CL1 to the third columnar portion CL3 are connected by an imaginary line is a "scalene triangle." That is, the second distance d2 between the first columnar portion CL1 and the third columnar portion CL3 is different from the third distance d3 between the second columnar portion CL2 and the third columnar portion CL3. For example, the central point of one columnar portion CL shifted in the Y axis direction from a middle point between the two columnar portions CL adjacent and spaced in the X axis direction is shifted by a distance "A" in the X axis direction from the columnar portions CL. In the semiconductor device 100*b*, the "scalene triangle" repeatedly appears in the X axis direction.

In the semiconductor device 100*b*, the third distance d3 is longer than the second distance d2. Therefore, even when a gap between the first columnar portion CL1 and the third columnar portion CL3 is blocked by, for example, a metal film, a gap between the second columnar portion CL2 and the third columnar portion CL3 can remain unblocked. Accordingly, like the semiconductor device 100*a* according to the first embodiment, a gas containing a metal precursor can be further flowed in the space S (see FIG. 5B) via the gap between the second columnar portion CL2 and the third columnar portion CL3.

Even in the semiconductor device 100*b*, the thickness of the metal film can be caused to be thick in a central region of the block (BLOCK) like the semiconductor device 100*a* according to the first embodiment. Accordingly, it is possible to prevent an increase in a resistant value of the conductive layer 21 and achieve low resistance of the conductive layer 21 in the stacked body 2 (see FIG. 2A).

Figure 14:
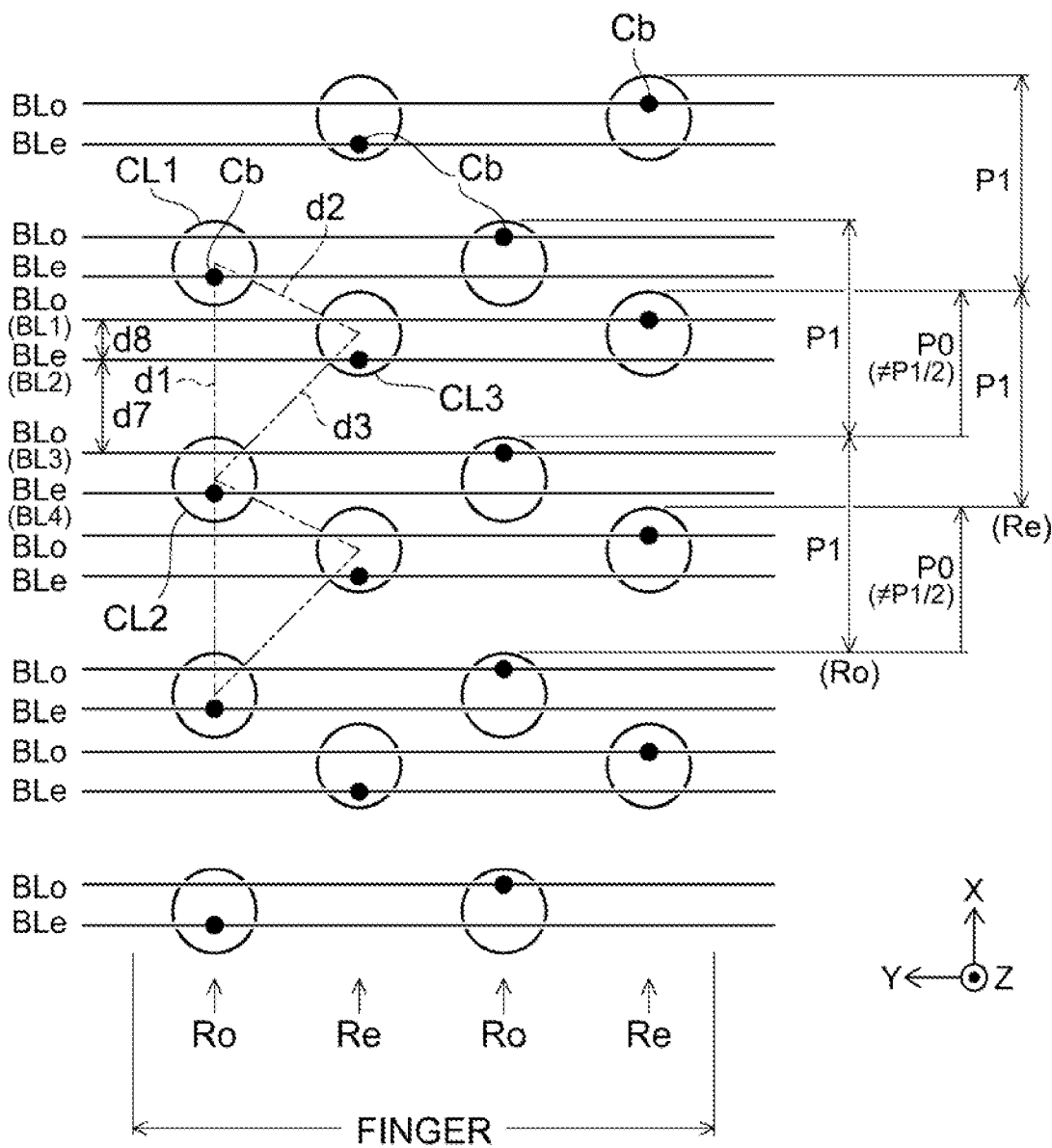
FIG. 14 is a schematic plan view exemplifying the semiconductor device according to the second embodiment.

FIG. 14 is a schematic plan view exemplifying the semiconductor device 100*b* according to the second embodiment. FIG. 14 illustrates a relation between the bit lines BL and the columnar portions CL in one finger (FINGER).

As illustrated in FIG. 14, in the semiconductor device 100*b*, for example two bit lines BL are disposed above each of the first columnar portion CL1 to the third columnar portion CL3. The two but line BL alternately include an odd bit line BLo and an even bit line BLe.

Above the second columnar portion CL2, the bit line BL3 is disposed as the odd bit line BLo and the bit line BL4 is disposed as the even bit line BLe. Above the third columnar portion CL3, the bit line BL1 is disposed as the odd bit line BLo and the bit line BL2 is disposed as the even bit line BLe. The bit line BL2 is disposed between the bit lines BL1 and BL3. The bit line BL2 is adjacent to each of the bit lines BL1 and BL3. The seventh distance d7 between the bit lines BL2 and BL3 in the X axis direction is larger than the eighth distance d8 between the bit lines BL1 and BL2 in the X axis direction.

In the semiconductor device 100*b*, the pitch between the columnar portions CL in the X axis direction is repeated as the first pitch Pb. However, a "scalene triangle" in which the central points of the first columnar portion CL1 to the third columnar portion CL3 are connected by an imaginary line is repeated in the X axis direction. Therefore, regions with different distances between the bit lines BL are included.

Even in the semiconductor device 100*b*, one finger includes, for example, four "rows" like the semiconductor device 100*a*. The four "rows" alternately include odd rows Ro and even rows Re. The first columnar portion CL1 and the second columnar portion CL2 belong to the odd rows Ro and the third columnar portion CL3 belongs to the even rows Re.

A "triangle" depicted on the X-Y plane by the first columnar portion CL1 to the third columnar portion CL3 is a scalene triangle. In this case, the odd rows Ro and the even rows Re are shifted, for example, by "P0" in the X axis direction. "P0" is different from "P1/2" (P0≠P1/2).

The semiconductor device 100*b* can be obtained, for example, by shifting the odd rows Ro and the even rows Re in the X axis direction by shifting "P0" different from the half (P1/2) of the pitch P1 between the columnar portions CL in the X axis direction.

Second Embodiment: First Modification Example

Figure 15:
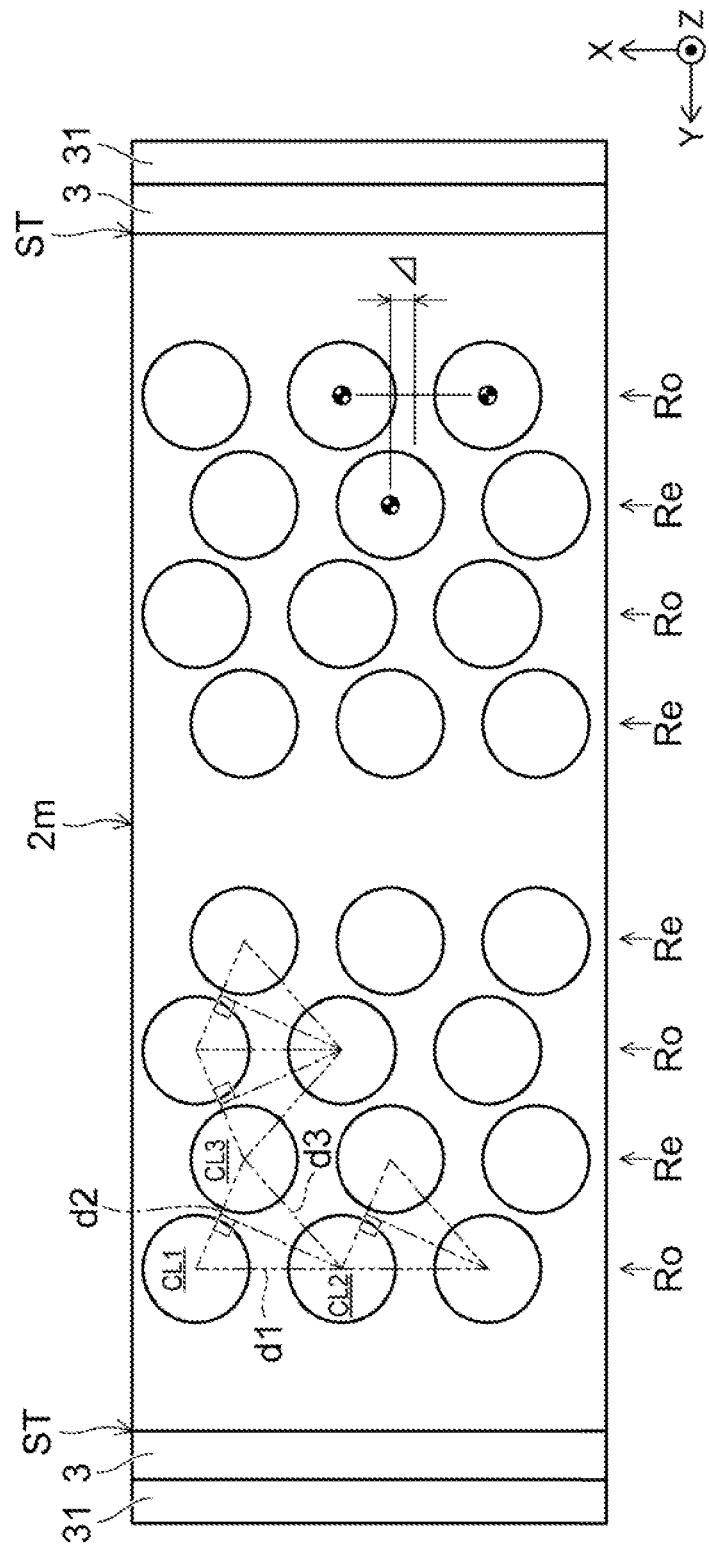
FIG. 15 is a schematic plan view exemplifying a semiconductor device according to a first modification example of the second embodiment.

FIG. 15 is a schematic plan view exemplifying a semiconductor device 100*ba* according to a first modification example of the second embodiment.

The semiconductor device 100*ba* according to the first modification example of the second embodiment is different from the semiconductor device 100*b* in that a "triangle in which the central points of the first columnar portion CL1 to the third columnar portion CL3 are connected by an imaginary line is an "isosceles triangle."

In the semiconductor device 100*ba*, the third columnar portion CL3 is spaced from the first columnar portion CL1 by the second distance d2. The second distance d2 is different from the first distance d1. Further, the third columnar portion CL3 is spaced from the second columnar portion CL2 by the third distance d3. The third distance d3 is the same as the first distance d1.

Even in the semiconductor device 100*ba*, the second distance d2 between the first columnar portion CL1 and the third columnar portion CL3 is different from the third distance d3 between the second columnar portion CL2 and the third columnar portion C13. The third distance d3 is longer than the second distance d2. Therefore, like the semiconductor device 100*b* according to the second embodiment, a gas containing a metal precursor can be further flowed in the space S (see FIG. 5B) via the gap between the second columnar portion CL2 and the third columnar portion CL3. Accordingly, like the semiconductor device 100*b*, the thickness of the metal film can be caused to be thick in a central region of the block (BLOCK). Accordingly, it is possible to prevent an increase in a resistant value of the conductive layer 21 and achieve low resistance of the conductive layer 21 in the stacked body 2 (see FIG. 2A).

As described above, according to the embodiments, it is possible to provide the semiconductor device capable of achieving low resistance of the conductive layer inside the stacked body.

The specific examples and the several modification examples of the embodiments of the present disclosure have been described. However, the embodiments of the present disclosure are not limited to the specific examples and the modification examples.

For example, the specific configuration of each component such as the base body 1, the stacked body 2, the columnar portions CL, and the like can be appropriately selected from the known scopes by those skilled in the art to realize embodiments of the present disclosure, and is included in the scope of the present disclosure as long as the same advantages can be obtained.

A combination of two or more components of each example is also included in the technical scope of the present disclosure as long as the combination is included in the gist of the present disclosure.

All the semiconductor devices of which designs are appropriately modified by those skilled in the art based on the above-described semiconductor devices also belong to the scope of the present disclosure as long as the modified semiconductor devices are included in the gist of the present disclosure.

It should be apparent to those skilled in the art that various modification examples and correction examples can be made within the categories of the present disclosure, and the modification examples and the correction examples are construed to belong to the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a base body comprising a semiconductor region;
   a stacked body comprising a plurality of alternating conductive layers and insulating layers located one over the other in a first direction over the semiconductor region of the base body;
   a plate-shaped portion comprising a first insulating material and extending through the stacked body in the first direction from an upper end of the stacked body to the base body and in contact with the semiconductor region, the plate-shaped portion also extending in a second direction crossing the first direction;
   a first columnar portion comprising a first semiconductor portion and a first memory film extending through the stacked body in the first direction from the upper end of the stacked body to the base body, the first semiconductor portion contacting the semiconductor region of the base body, the first memory film being located between the first semiconductor portion layer and at least one of the conductive layers in the stacked body;
   a second columnar portion comprising a second semiconductor portion and a second memory film extending through the stacked body in the first direction from the upper end of the stacked body to the base body, the second semiconductor portion contacting the semiconductor region of the base body, the second memory film being located between the second semiconductor portion and at least one of the conductive layers in the stacked body, and the second columnar portion being spaced from the first columnar portion in the second direction; and
   a third columnar portion comprising a third semiconductor portion and a third memory film extending through the stacked body in the first direction from the upper end of the stacked body to the base body and in contact with the semiconductor region, the third semiconductor portion contacting the semiconductor region of the base body, the third memory film being located between the third semiconductor portion and at least one of the conductive layers in the stacked body, the third columnar portion being located between the first columnar portion and the second columnar portion in the second direction, wherein
   a first separation distance in the second direction between the first columnar portion and the third columnar portion is different from a second separation distance in the second direction between the second columnar portion and the third columnar portion.

2. The semiconductor device according to claim 1, wherein the first separation distance is less than the second separation distance.

3. The semiconductor device according to claim 2, further comprising:
   a fourth columnar portion comprising a fourth semiconductor portion and a fourth memory film extending through the stacked body in the first direction from the upper end of the stacked body to the base body, the fourth semiconductor portion contacting the semiconductor region of the base body, the fourth memory film being located between the fourth semiconductor portion and at least one of the conductive layers in the stacked body, the second columnar portion being located between the third columnar portion and the fourth columnar portion in the second direction; and
   a fifth columnar portion comprising a fifth semiconductor portion and a fifth memory film extending through the stacked body in the first direction from the upper end of the stacked body to the base body, the fifth semiconductor portion contacting the semiconductor region of the base body, the fifth memory film being located between the fifth semiconductor portion and at least one of the conductive layers in the stacked body, the fourth columnar portion being located between the second columnar portion and the fifth columnar portion in the second direction, wherein a third separation distance in the second direction between the second columnar portion and the fourth columnar portion is equal to the first separation distance, and a fourth separation distance in the second direction between the fourth columnar portion and the fifth columnar portion is equal to the second separation distance.

4. The semiconductor device according to claim 3, further comprising:

a sixth columnar portion comprising a sixth semiconductor portion and a sixth memory film extending through the stacked body in the first direction from the upper end of the stacked body to the base body, the sixth semiconductor portion contacting the semiconductor region of the base body, the sixth memory film being located between the sixth semiconductor portion and at least one of the conductive layers in the stacked body, the sixth columnar portion being spaced from the first columnar portion and the third columnar portion and located between the first columnar portion and the third columnar portion in the second direction; and a seventh columnar portion comprising a seventh semiconductor portion and a seventh memory film extending through the stacked body in the first direction from the upper end of the stacked body to the base body, the seventh semiconductor portion contacting the semiconductor region of the base body, the seventh memory film being located between the seventh semiconductor portion and at least one of the conductive layers in the stacked body, the seventh columnar portion being aligned with the sixth columnar portion in the second direction, spaced from the third columnar portion and the second columnar portion, and located between the third columnar portion and the second columnar portion in the second direction, wherein a fifth separation distance in the second direction between the sixth columnar portion and the seventh columnar portion is equal to the second separation distance.

5. The semiconductor device according to claim 4, wherein a separation distance between the sixth columnar portion and the first columnar portion is equal to a separation distance between the sixth columnar portion and the third columnar portion.

6. The semiconductor device according to claim 4, wherein a separation distance between the sixth columnar portion and the first columnar portion is less than a separation distance between the sixth columnar portion and the third columnar portion.

7. The semiconductor device according to claim 2, further comprising:

a fourth columnar portion comprising a fourth semiconductor portion and a fourth memory film extending through the stacked body in the first direction from the upper end of the stacked body to the base body, the fourth semiconductor portion contacting the semiconductor region of the base body, the fourth memory film being located between the fourth semiconductor portion and at least one of the conductive layers in the stacked body, the second columnar portion being located between the third columnar portion and the fourth columnar portion in the second direction; and a fifth columnar portion comprising a fifth semiconductor portion and a fifth memory film extending through the stacked body in the first direction from the upper end of the stacked body to the base body, the fifth semiconductor portion contacting the semiconductor region of the base body, the fifth memory film being located between the fifth semiconductor portion and at least one of the conductive layers in the stacked body, the fourth columnar portion being located between the second columnar portion and the fifth columnar portion in the second direction, wherein a third separation distance in the second direction between the second columnar portion and the fourth columnar portion is equal to the first separation distance, and a fourth separation distance in the second direction between the fourth columnar portion and the fifth columnar portion is equal to the first separation distance.

8. The semiconductor device according to claim 7, further comprising:

a sixth columnar portion comprising a sixth semiconductor portion and a sixth memory film extending through the stacked body in the first direction from the upper end of the stacked body to the base body, the sixth semiconductor portion contacting the semiconductor region of the base body, the sixth memory film being located between the sixth semiconductor portion and at least one of the conductive layers in the stacked body, the sixth columnar portion being spaced from the first columnar portion and the third columnar portion and located between the first columnar portion and the third columnar portion in the second direction; and a seventh columnar portion comprising a seventh semiconductor portion and a seventh memory film extending through the stacked body in the first direction from the upper end of the stacked body to the base body, the seventh semiconductor portion contacting the semiconductor region of the base body, the seventh memory film being located between the seventh semiconductor portion and at least one of the conductive layers in the stacked body, the seventh columnar portion being aligned with the sixth columnar portion in the second direction, spaced from the third columnar portion and the second columnar portion, and located between the third columnar portion and the second columnar portion in the second direction, wherein a fifth separation distance in the second direction between the sixth columnar portion and the seventh columnar portion is equal to the second separation distance.

9. The semiconductor device according to claim 8, wherein a separation distance between the sixth columnar portion and the first columnar portion is equal to a separation distance between the sixth columnar portion and the third columnar portion.

10. The semiconductor device according to claim 9, wherein a separation distance between the sixth columnar portion and the first columnar portion is less than a separation distance between the sixth columnar portion and the third columnar portion.

11. The semiconductor device according to claim 1, wherein at least one of the first, second, and third semiconductor portions extends into the semiconductor region of the base body.

* * * * *